US011743640B2

(12) United States Patent
Oishi et al.

(10) Patent No.: US 11,743,640 B2
(45) **Date of Patent: *Aug. 29, 2023**

(54) PRIVACY SETTING FOR SOUND LEAKAGE CONTROL

(71) Applicant: Meta Platforms Technologies, LLC, Menlo Park, CA (US)

(72) Inventors: Tetsuro Oishi, Bothell, WA (US); Gelmont Rios, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/921,333

(22) Filed: Jul. 6, 2020

(65) Prior Publication Data

US 2021/0204058 A1 Jul. 1, 2021

Related U.S. Application Data

(60) Provisional application No. 62/955,710, filed on Dec. 31, 2019.

(51) Int. Cl.
*H03G 5/00* (2006.01)
*H04R 3/00* (2006.01)
(Continued)

(52) U.S. Cl.
CPC ............... *H04R 3/002* (2013.01); *H04R 3/04* (2013.01); *H04R 5/04* (2013.01); *H04R 2201/40* (2013.01); *H04R 2420/07* (2013.01)

(58) Field of Classification Search
CPC .................................... H04R 3/04; H04R 5/04
(Continued)

(56) References Cited

U.S. PATENT DOCUMENTS 5,416,846 A 5/1995 Tamura et al.
6,181,801 B1 * 1/2001 Puthuff .................. H04B 1/385 381/380
(Continued)

FOREIGN PATENT DOCUMENTS

EP 3413589 A1 12/2018
EP 3518557 A1 7/2019
WO 2015103578 A1 7/2015

OTHER PUBLICATIONS

PCT International Search Report and Written Opinion, PCT Application No. PCT/US2020/062525, dated Mar. 10, 2021, nine pages.
(Continued)

*Primary Examiner* — Katherine A Faley
(74) *Attorney, Agent, or Firm* — Fenwick & West LLP

(57) ABSTRACT

An audio system includes a speaker and a processor. The processor determines a privacy setting for an audio signal. The privacy setting may be selected by a user. The privacy setting may indicate activation of a private mode, or may indicate a privacy level from a range of privacy levels. The processor determines an audio filter that adjusts the audio signal to mitigate sound leakage when presented by the speaker based on the privacy setting. The audio filter may include a low-pass filter and a multiband compressor. The parameters of the audio filter may vary based on the privacy setting. The processor applies the audio filter to the audio signal to generate a filtered audio signal and provides the filtered audio signal to the speaker.

21 Claims, 9 Drawing Sheets

700

(51) Int. Cl.
*H04R 5/04* (2006.01)
*H04R 3/04* (2006.01)

(58) Field of Classification Search
USPC ........................................... 381/74, 98, 102
See application file for complete search history.

(56) References Cited

U.S. PATENT DOCUMENTS

| | | | | |
|---|---|---|---|---|
| 9,263,023 | B2 | 2/2016 | Anazawa | |
| 9,948,256 | B1 | 4/2018 | Dow et al. | |
| 10,728,655 | B1 | 7/2020 | Miller et al. | |
| 10,812,926 | B2 | 10/2020 | Asada et al. | |
| 10,834,949 | B2 | 11/2020 | Benmoussa | |
| 10,897,668 | B1 | 1/2021 | Miller et al. | |
| 11,070,912 | B2 | 7/2021 | Mehra et al. | |
| 11,212,606 | B1 * | 12/2021 | Oishi | G10L 25/51 |
| 11,284,191 | B1 | 3/2022 | Miller et al. | |
| 11,350,197 | B2 | 5/2022 | Araki et al. | |
| 2004/0209654 | A1 | 10/2004 | Cheung et al. | |
| 2006/0109983 | A1 | 5/2006 | Young et al. | |
| 2007/0135176 | A1 | 6/2007 | Ho et al. | |
| 2009/0097679 | A1 | 4/2009 | Maeda | |
| 2010/0239108 | A1 * | 9/2010 | Fletcher | H04R 1/26 381/151 |
| 2011/0007907 | A1 | 1/2011 | Park et al. | |
| 2011/0293105 | A1 | 12/2011 | Arie et al. | |
| 2012/0057718 | A1 | 3/2012 | Vernon | |
| 2012/0140917 | A1 | 6/2012 | Nicholson et al. | |
| 2013/0201397 | A1 | 8/2013 | Ayoub et al. | |
| 2013/0216060 | A1 | 8/2013 | Narayan et al. | |
| 2013/0259250 | A1 | 10/2013 | Nicholson et al. | |
| 2014/0126757 | A1 * | 5/2014 | Davis | H04R 5/02 381/349 |
| 2014/0270316 | A1 | 9/2014 | Fan | |
| 2015/0057999 | A1 | 2/2015 | Leorin et al. | |
| 2015/0116212 | A1 * | 4/2015 | Freed | G06F 1/1686 345/156 |
| 2015/0195641 | A1 | 7/2015 | Di Censo et al. | |
| 2015/0341734 | A1 | 11/2015 | Sherman | |
| 2016/0071526 | A1 | 3/2016 | Wingate et al. | |
| 2016/0261532 | A1 | 9/2016 | Garbin et al. | |
| 2016/0330546 | A1 | 11/2016 | Barrentine et al. | |
| 2018/0233159 | A1 | 8/2018 | Hera et al. | |
| 2018/0359572 | A1 | 12/2018 | Jensen et al. | |
| 2019/0069070 | A1 | 2/2019 | Patil | |
| 2019/0069083 | A1 | 2/2019 | Salehin et al. | |
| 2019/0238971 | A1 | 8/2019 | Wakeland et al. | |
| 2019/0394564 | A1 | 12/2019 | Mehra et al. | |
| 2020/0053256 | A1 | 2/2020 | Yoshimura | |

OTHER PUBLICATIONS

International Search Report and Written Opinion for International Application No. PCT/US2020/025942, dated Jun. 23, 2020, 10 pages.

Non-Final Office Action dated Dec. 4, 2019 for U.S. Appl. No. 16/221,864, filed Dec. 17, 2018, 8 Pages.

Non-Final Office Action dated Aug. 20, 2020 for U.S. Appl. No. 16/379,450, filed Apr. 9, 2019, 12 pages.

Non-Final Office Action dated Aug. 25, 2021 for U.S. Appl. No. 17/119,327, filed Dec. 11, 2020, 8 Pages.

Co-pending U.S. Appl. No. 17/532,828, inventor Oishi; Tetsuro, filed Nov. 22, 2021.

International Preliminary Report on Patentability for International Application No. PCT/US2020/062525, dated Jul. 14, 2022, 8 pages.

Non-Final Office Action dated Nov. 10, 2022 for U.S. Appl. No. 17/532,828, filed Nov. 22, 2021, 8 pages.

Non-Final Office Action dated Jan. 28, 2022 for U.S. Appl. No. 17/182,949, filed Feb. 23, 2021, 16 pages.

* cited by examiner

600

700

PRIVACY SETTING FOR SOUND LEAKAGE CONTROL

CROSS REFERENCE TO RELATED APPLICATIONS

This application claims the benefit of U.S. Provisional Application No. 62/955,710, filed Dec. 31, 2019, which is incorporated by reference in its entirety.

FIELD OF THE INVENTION

This disclosure relates generally to artificial reality systems, and more specifically to controlling sound leakage for artificial reality systems.

BACKGROUND

Headsets, such as artificial reality headsets, include audio systems that provide audio content. The audio systems generate audio content which is presented to a user of the headset. However, the audio content presented by typical audio systems may be audible to other persons or devices close to the headset. For many reasons, such as for privacy, the user may wish to prevent other persons or devices from detecting or understanding the audio content presented by the audio system.

SUMMARY

An audio system for a headset is configured to decrease sound leakage into a local area of the headset based on a privacy setting. The headset provides audio content to a user of the headset. However, it may be undesirable for the audio content to be audible to other persons or devices near the headset. The audio system may use audio filters to mitigate leakage of the audio content into the local area, particularly for frequency bands in which the (e.g., dipole) speaker is relatively less effective at mitigating sound leakage. The audio system may band-limit the audio content to mitigate leakage of particular frequencies of the audio content into the local area based on the privacy setting. The privacy setting may be set by a user using an application user interface or a mechanical user interface. In one example, the privacy setting defines a selection between a private mode where an audio filter is applied to an audio signal or a non-private mode where the audio filter is not applied. In another example, the privacy setting defines a privacy level from a range of privacy levels, and the characteristics of the audio filter applied to the audio signal is set based on the privacy level. The audio system may include a dipole speaker. The dipole speaker may be relatively effective at mitigating sound leakage below 3,000 Hz, while the audio filter may be used to mitigate sound leakage for higher frequencies depending on the privacy setting.

Some embodiments include an audio system. The audio system includes a speaker and a processor. The processor determines a privacy setting for an audio signal. The processor determines an audio filter that adjusts the audio signal to mitigate sound leakage when presented by the speaker based on the privacy setting. The processor applies the audio filter to the audio signal to generate a filtered audio signal, and provides the filtered audio signal to the speaker.

Some embodiments include a method performed by a processor of an audio system. The method includes determining a privacy setting for an audio signal. The method further includes determining determine an audio filter that adjusts the audio signal to mitigate sound leakage when presented by a speaker of the audio system based on the privacy setting. The method further includes applying the audio filter to the audio signal to generate a filtered audio signal, and providing the filtered audio signal to the speaker.

Some embodiments include a non-transitory computer readable medium storing instructions that, when executed by a processor, cause the processor to perform steps comprising determining a privacy setting for an audio signal, determining an audio filter that adjusts the audio signal to mitigate sound leakage when presented by a speaker based on the privacy setting, applying the audio filter to the audio signal to generate a filtered audio signal, and providing the filtered audio signal to the speaker.

Figure 1A:
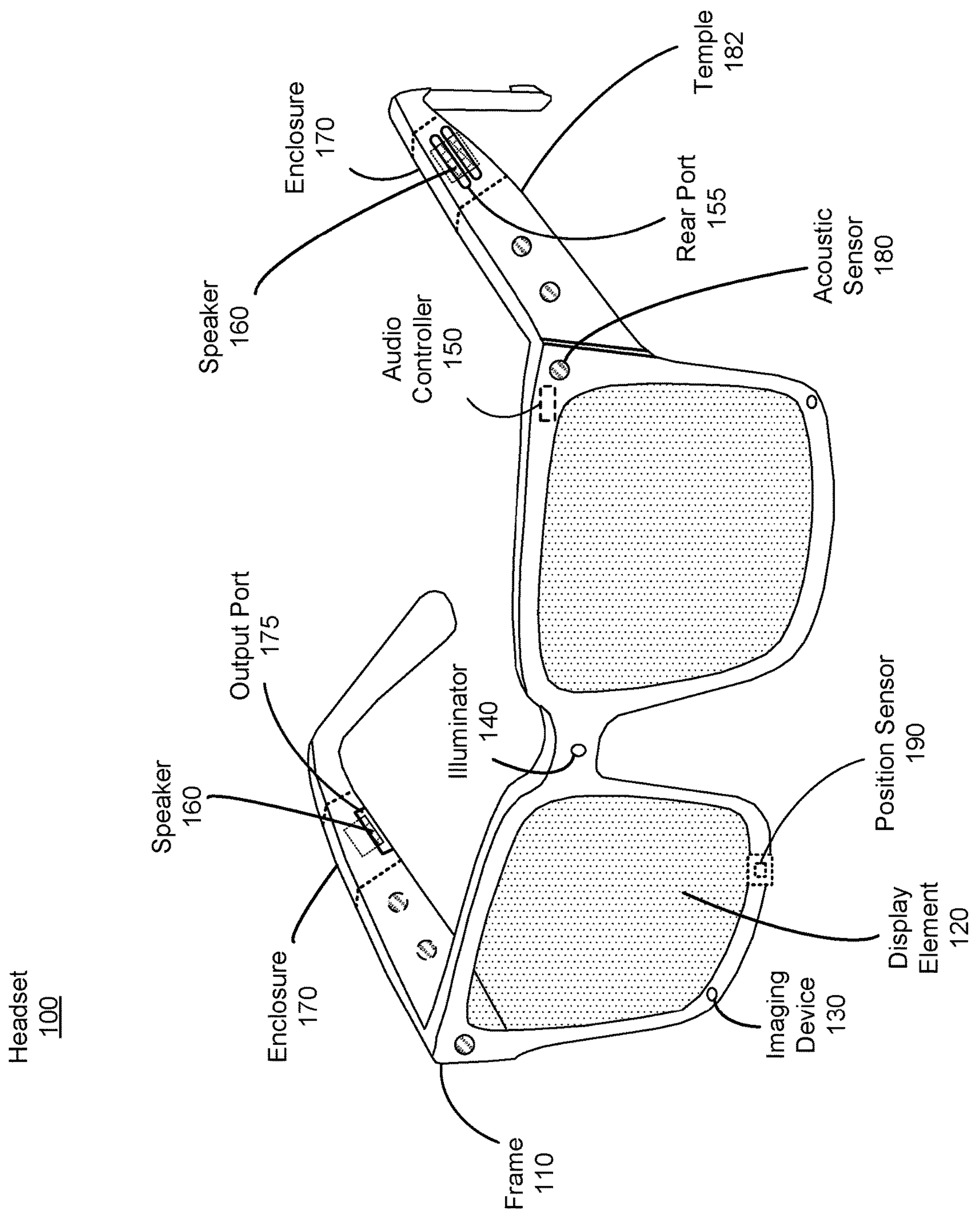
FIG. 1A is a perspective view of a headset implemented as an eyewear device, in accordance with one or more embodiments.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION

An audio system is configured to mitigate sound leakage into a local environment based on a privacy setting. Leakage refers to the effect of sound from a speaker (e.g., headphones) escaping into the outside world. Mitigating sound leakage increases the privacy for a user of the audio system and also decreases disturbances for others in the local area, but there may be a trade off in sound quality. As such, the privacy setting allows a user to select between higher privacy or sound quality. The privacy setting may be selected by the user using an application user interface or a mechanical user interface. The privacy setting may define a selection of a privacy level from a range of privacy levels, or may define a selection between a private mode being on or off.

The audio system includes one or more speakers and a circuitry (e.g., audio controller or processor) that controls audio content output by the audio system. The audio system may be a component of a device worn and/or carried by a user that includes the audio system, and is configured to present audio to a user via the audio system. A personal audio device may be, e.g., an artificial reality headset, a cellphone, some other device configured to present audio to a user via the audio system, or some combination thereof.

The audio system may include a dipole speaker. The dipole speaker may mitigate sound leakage into the local area by canceling sounds with destructive interference in the far field (e.g., 50 cm or more.) Dipole speakers typically are relatively more effective at canceling sound waves at lower frequencies, such as below 3,000 Hz. The audio system applies audio filters to attenuate sounds at various frequencies, including frequencies over 3,000 Hz, to mitigate sound leakage into the local area. The audio system may dynamically select filters to attenuate the audio content based on the privacy setting. In some embodiments, the privacy setting may be determined programmatically, such as based on environmental conditions, the type of audio content being presented, the presence of other people in a local area, the frequency of the audio content being presented, or some combination thereof.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to create content in an artificial reality and/or are otherwise used in an artificial reality. The artificial reality system that provides the artificial reality content may be implemented on various platforms, including a wearable device (e.g., headset) connected to a host computer system, a standalone wearable device (e.g., headset), a mobile device or computing system, or any other hardware platform capable of providing artificial reality content to one or more viewers.

FIG. 1A is a perspective view of a headset 100 implemented as an eyewear device, in accordance with one or more embodiments. In some embodiments, the eyewear device is a near eye display (NED). In general, the headset 100 may be worn on the face of a user such that content (e.g., media content) is presented using a display assembly and/or an audio system. However, the headset 100 may also be used such that media content is presented to a user in a different manner. Examples of media content presented by the headset 100 include one or more images, video, audio, or some combination thereof. The headset 100 includes a frame, and may include, among other components, a display assembly including one or more display elements 120, a depth camera assembly (DCA), an audio system, and a position sensor 190. While FIG. 1A illustrates the components of the headset 100 in example locations on the headset 100, the components may be located elsewhere on the headset 100, on a peripheral device paired with the headset 100, or some combination thereof. Similarly, there may be more or fewer components on the headset 100 than what is shown in FIG. 1A.

The frame 110 holds the other components of the headset 100. The frame 110 includes a front part that holds the one or more display elements 120 and end pieces (e.g., temples) to attach to a head of the user. The front part of the frame 110 bridges the top of a nose of the user. The length of the end pieces may be adjustable (e.g., adjustable temple length) to fit different users. The end pieces may also include a portion that curls behind the ear of the user (e.g., temple tip, ear piece).

The one or more display elements 120 provide light to a user wearing the headset 100. As illustrated the headset includes a display element 120 for each eye of a user. In some embodiments, a display element 120 generates image light that is provided to an eyebox of the headset 100. The eyebox is a location in space that an eye of user occupies while wearing the headset 100. For example, a display element 120 may be a waveguide display. A waveguide display includes a light source (e.g., a two-dimensional source, one or more line sources, one or more point sources, etc.) and one or more waveguides. Light from the light source is in-coupled into the one or more waveguides which outputs the light in a manner such that there is pupil replication in an eyebox of the headset 100. In-coupling and/or outcoupling of light from the one or more waveguides may be done using one or more diffraction gratings. In some embodiments, the waveguide display includes a scanning element (e.g., waveguide, mirror, etc.) that scans light from the light source as it is in-coupled into the one or more waveguides. Note that in some embodiments, one or both of the display elements 120 are opaque and do not transmit light from a local area around the headset 100. The local area is the area surrounding the headset 100. For example, the local area may be a room that a user wearing the headset 100 is inside, or the user wearing the headset 100 may be outside and the local area is an outside area. In this context, the headset 100 generates VR content. Alternatively, in some embodiments, one or both of the display elements 120 are at least partially transparent, such that light from the local area may be combined with light from the one or more display elements to produce AR and/or MR content.

In some embodiments, a display element 120 does not generate image light, and instead is a lens that transmits light from the local area to the eyebox. For example, one or both of the display elements 120 may be a lens without correction (non-prescription) or a prescription lens (e.g., single vision, bifocal and trifocal, or progressive) to help correct for defects in a user's eyesight. In some embodiments, the display element 120 may be polarized and/or tinted to protect the user's eyes from the sun.

In some embodiments, the display element 120 may include an additional optics block (not shown). The optics block may include one or more optical elements (e.g., lens, Fresnel lens, etc.) that direct light from the display element 120 to the eyebox. The optics block may, e.g., correct for aberrations in some or all of the image content, magnify some or all of the image, or some combination thereof.

The DCA determines depth information for a portion of a local area surrounding the headset 100. The DCA includes one or more imaging devices 130 and a DCA controller (not shown in FIG. 1A), and may also include an illuminator 140. In some embodiments, the illuminator 140 illuminates a portion of the local area with light. The light may be, e.g., structured light (e.g., dot pattern, bars, etc.) in the infrared (IR), IR flash for time-of-flight, etc. In some embodiments, the one or more imaging devices 130 capture images of the portion of the local area that include the light from the illuminator 140. As illustrated, FIG. 1A shows a single illuminator 140 and two imaging devices 130. In alternate embodiments, there is no illuminator 140 and at least two imaging devices 130.

The DCA controller computes depth information for the portion of the local area using the captured images and one or more depth determination techniques. The depth determination technique may be, e.g., direct time-of-flight (ToF) depth sensing, indirect ToF depth sensing, structured light, passive stereo analysis, active stereo analysis (uses texture added to the scene by light from the illuminator 140), some other technique to determine depth of a scene, or some combination thereof.

The audio system provides audio content. The audio system includes a transducer array, a sensor array, and an audio controller 150. However, in other embodiments, the audio system may include different and/or additional components. Similarly, in some cases, functionality described with reference to the components of the audio system can be distributed among the components in a different manner than is described here. For example, some or all of the functions of the controller may be performed by a remote server.

The transducer array presents sound to user. The transducer array includes a plurality of transducers. A transducer may be a speaker 160 or a tissue transducer (e.g., a bone conduction transducer or a cartilage conduction transducer). In some embodiments, instead of individual speakers for each ear, the headset 100 includes a speaker array comprising multiple speakers integrated into the frame 110 to improve directionality of presented audio content. The tissue transducer couples to the head of the user and directly vibrates tissue (e.g., bone or cartilage) of the user to generate sound. The number and/or locations of transducers may be different from what is shown in FIG. 1A.

As shown in FIG. 1A, the audio system of the headset 100 includes an audio assembly coupled to each side of the frame 110, including speakers 160 and enclosures 170, corresponding to the right and left ears of the user. Each of the speakers 160 is contained in a respective enclosure 170. In FIG. 1A, each of the enclosures 170 is shown integrated into a temple 182 of the frame 110, but an enclosure may be coupled to the frame in a different configuration, according to some embodiments. Each of the enclosures 170 includes an output port 175 coupled to a front cavity of the respective enclosure and at least one rear port 155 coupled to a rear cavity of the enclosure. In other embodiments, an enclosure may include more than one output port and one or more rear ports. In some embodiments, at least one of the rear ports is a resistive port configured to dampen the sound emitted from the rear cavity of the enclosure 170. The speaker 160 emits sound, in response to an electronic audio signal received from the audio controller 150. The audio controller 150 may provide and transmit instructions for the audio system to present audio content to the user. The output port 175 is configured to output a first portion of the sound from the front cavity of the enclosure 170, and the rear ports 155 are configured to output a second portion of the sound from the rear cavity of the enclosure 170. The first portion of the sound and the second portion of the sound may destructively interfere with each other, such that a portion of the sound is canceled in the far field.

The distance between the output port 175 and a rear port 155 may vary. If the output port 175 and rear port 155 are relatively close, the high frequency in the far field is canceled more effectively, but this may result in worse playback in the near field as potential for destructive interference increases.

The audio controller 150 applies audio filters to the audio content to mitigate the leakage of the audio content into the local area. The audio controller 150 determines a privacy setting for an audio signal, determines an audio filter that adjusts the audio signal to mitigate sound leakage when presented by a speaker 160 based on the privacy setting, applies the audio filter to the audio signal, and provides the audio signal to the speaker 160. The privacy setting may be set by a user using an application user interface (e.g., presented by the imaging device 130) and/or a mechanical user interface (e.g., on the frame 110). The privacy setting may define a selection between a private mode where the audio filter is applied to the audio signal or a non-private mode where the audio filter is not applied. The private mode provides increased privacy by reducing sound leakage, but with reduced quality of playback for the audio content. The non-private mode provides improved quality of playback, but with more sound leakage than the private mode. In another example, the privacy setting defines a privacy level from a range of privacy levels. The audio controller 150 determines the characteristics of the audio filter based on the privacy level. Here, the audio controller 150 provides for sliding amount in the tradeoff between reduction in sound leakage and audio playback quality.

The audio filter defined by the privacy setting may include one or more filters and one or more compressors. The audio controller 150 determines an attenuation level a frequency band of the audio signal, and determines the audio filter based on the attenuation level. Different frequency bands of the audio signal may include different attenuation levels based on the privacy setting. The audio controller 150 may associate different privacy settings with different attenuation levels of frequency bands, and adjust the audio filter based on the attenuation levels of the frequency bands.

In some embodiments, the privacy setting may be determined based on factors such as the content being presented and/or environmental conditions in the local area. For example, if the audio content being presented includes speech, the audio controller 150 may increase the privacy setting to apply filters which minimize leakage while maintaining intelligibility of the speech for the user. If an environmental condition indicates that increased mitigation is desirable, such as if the headset is in a quiet environment or if there are other people near the user, the audio controller may increase the privacy setting and the amount of sound leakage mitigation. In contrast, if an environmental condition indicates that the headset is in a loud environment or that the user is alone, the audio controller may decrease the privacy setting and apply less restrictive audio filters to improve the audio experience for the user. In some embodiments, the audio controller 150 determines an environmental condition programmatically, such as based on data received from one or more sensors of the headset 100.

The audio controller 150 processes information from the sensor array that describes sounds detected by the sensor array. The audio controller 150 may be a circuitry, such as a processor and a computer-readable storage medium. In other examples, the circuitry may include an application-specific integrated circuit (ASIC), field-programmable gate array (FPGA), or some other type of processing circuit. The audio controller 150 may be configured to generate direction of arrival (DOA) estimates, generate acoustic transfer functions (e.g., array transfer functions and/or head-related transfer functions), track the location of sound sources, form beams in the direction of sound sources, classify sound sources, generate audio filters for the speakers 160, or some combination thereof.

The sensor array detects sounds within the local area of the headset 100. The sensor array includes a plurality of acoustic sensors 180. An acoustic sensor 180 captures sounds emitted from one or more sound sources in the local area (e.g., a room). Each acoustic sensor is configured to detect sound and convert the detected sound into an electronic format (analog or digital). The acoustic sensors 180 may be acoustic wave sensors, microphones, sound transducers, or similar sensors that are suitable for detecting sounds.

In some embodiments, one or more acoustic sensors 180 may be placed in an ear canal of each ear (e.g., acting as binaural microphones). In some embodiments, the acoustic sensors 180 may be placed on an exterior surface of the headset 100, placed on an interior surface of the headset 100, separate from the headset 100 (e.g., part of some other device), or some combination thereof. The number and/or locations of acoustic sensors 180 may be different from what is shown in FIG. 1A. For example, the number of acoustic detection locations may be increased to increase the amount of audio information collected and the sensitivity and/or accuracy of the information. The acoustic detection locations may be oriented such that the microphone is able to detect sounds in a wide range of directions surrounding the user wearing the headset 100.

Some embodiments of the headset 100 and audio system have different components than those described here. For example, the enclosure 170 may include a different configuration of ports, for example, with a different number, shape, type, and/or size of ports. The example of the audio system shown in FIG. 1A includes two enclosures 170, each enclosure containing a speaker, corresponding to a left and right ear for presenting stereo sound. In some embodiments, the audio system comprises a speaker array including a plurality of enclosures 170 (e.g. more than two) coupled to the frame 110 of the headset 100. In this case, each enclosure may contain one or more speakers. Similarly, in some cases, functions can be distributed among the components in a different manner than is described here. Additionally, the dimensions or shapes of the components may be different.

The position sensor 190 generates one or more measurement signals in response to motion of the headset 100. The position sensor 190 may be located on a portion of the frame 110 of the headset 100. The position sensor 190 may include an inertial measurement unit (IMU). Examples of position sensor 190 include: one or more accelerometers, one or more gyroscopes, one or more magnetometers, another suitable type of sensor that detects motion, a type of sensor used for error correction of the IMU, or some combination thereof. The position sensor 190 may be located external to the IMU, internal to the IMU, or some combination thereof.

In some embodiments, the headset 100 may provide for simultaneous localization and mapping (SLAM) for a position of the headset 100 and updating of a model of the local area. For example, the headset 100 may include a passive camera assembly (PCA) that generates color image data. The PCA may include one or more RGB cameras that capture images of some or all of the local area. In some embodiments, some or all of the imaging devices 130 of the DCA may also function as the PCA. The images captured by the PCA and the depth information determined by the DCA may be used to determine parameters of the local area, generate a model of the local area, update a model of the local area, or some combination thereof. Furthermore, the position sensor 190 tracks the position (e.g., location and pose) of the headset 100 within the room. Additional details regarding the components of the headset 100 are discussed below in connection with FIG. 5.

Figure 1B:
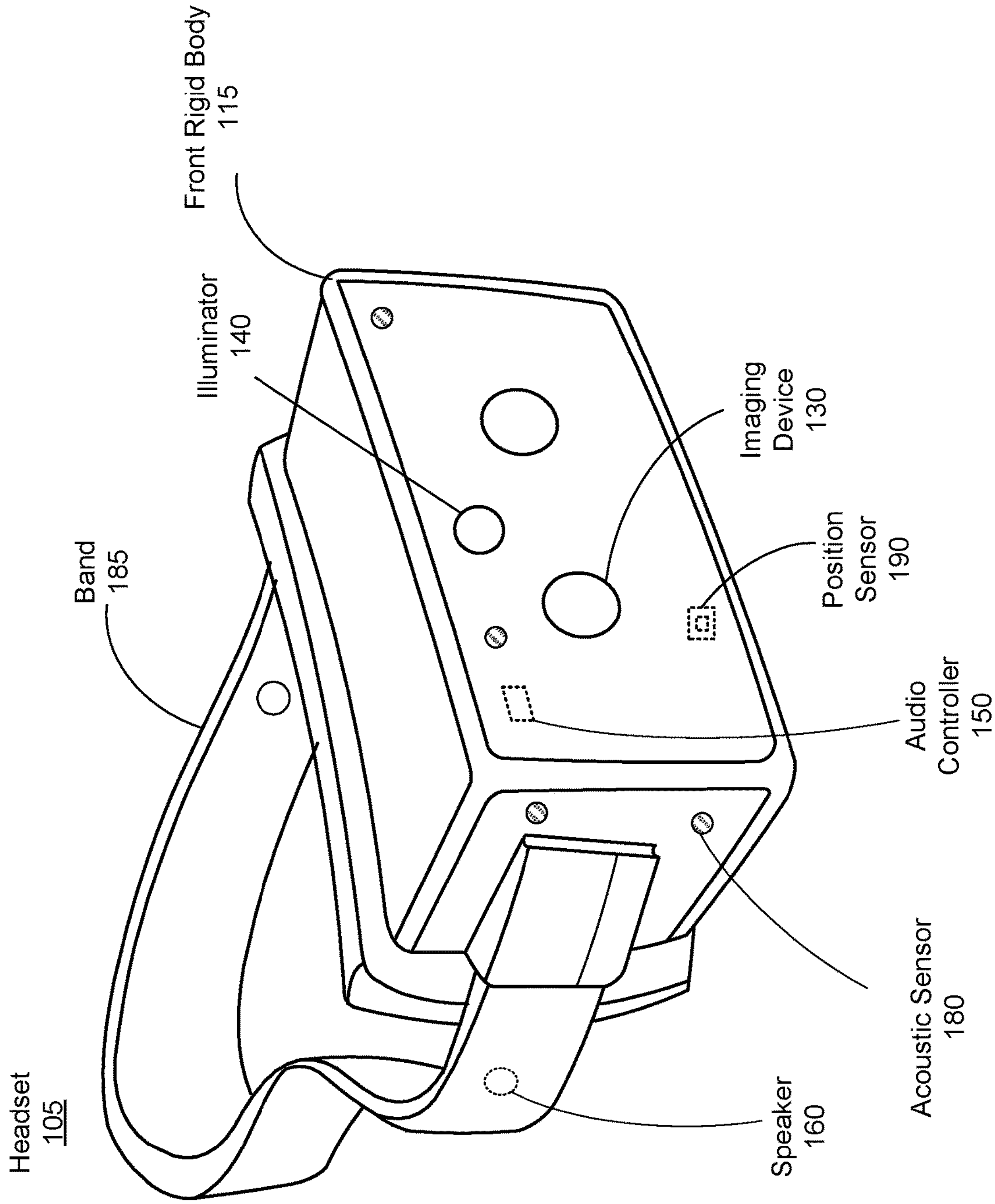
FIG. 1B is a perspective view of a headset implemented as a head-mounted display (HMD), in accordance with one or more embodiments.

FIG. 1B is a perspective view of a headset 105 implemented as an HMD, in accordance with one or more embodiments. In embodiments that describe an AR system and/or a MR system, portions of a front side of the HMD are at least partially transparent in the visible band (~380 nm to 750 nm), and portions of the HMD that are between the front side of the HMD and an eye of the user are at least partially transparent (e.g., a partially transparent electronic display). The HMD includes a front rigid body 115 and a band 185. The headset 105 includes many of the same components described above with reference to FIG. 1A, but modified to integrate with the HMD form factor. For example, the HMD includes a display assembly, a DCA, an audio system, and a position sensor 190. FIG. 1B shows the illuminator 140, a plurality of the speakers 160, a plurality of the imaging devices 130, a plurality of acoustic sensors 180, and the position sensor 190. The speakers 160 may be located in various locations, such as coupled to the band 185 (as shown), coupled to front rigid body 115, or may be configured to be inserted within the ear canal of a user. One or more of the speakers 160 may be a dipole speaker configured to mitigate sound leakage. Additionally, the audio system may be configured to selectively apply audio filters to the audio content presented by the speakers 160 to mitigate sound leakage, such as based on a privacy setting.

Figure 2:
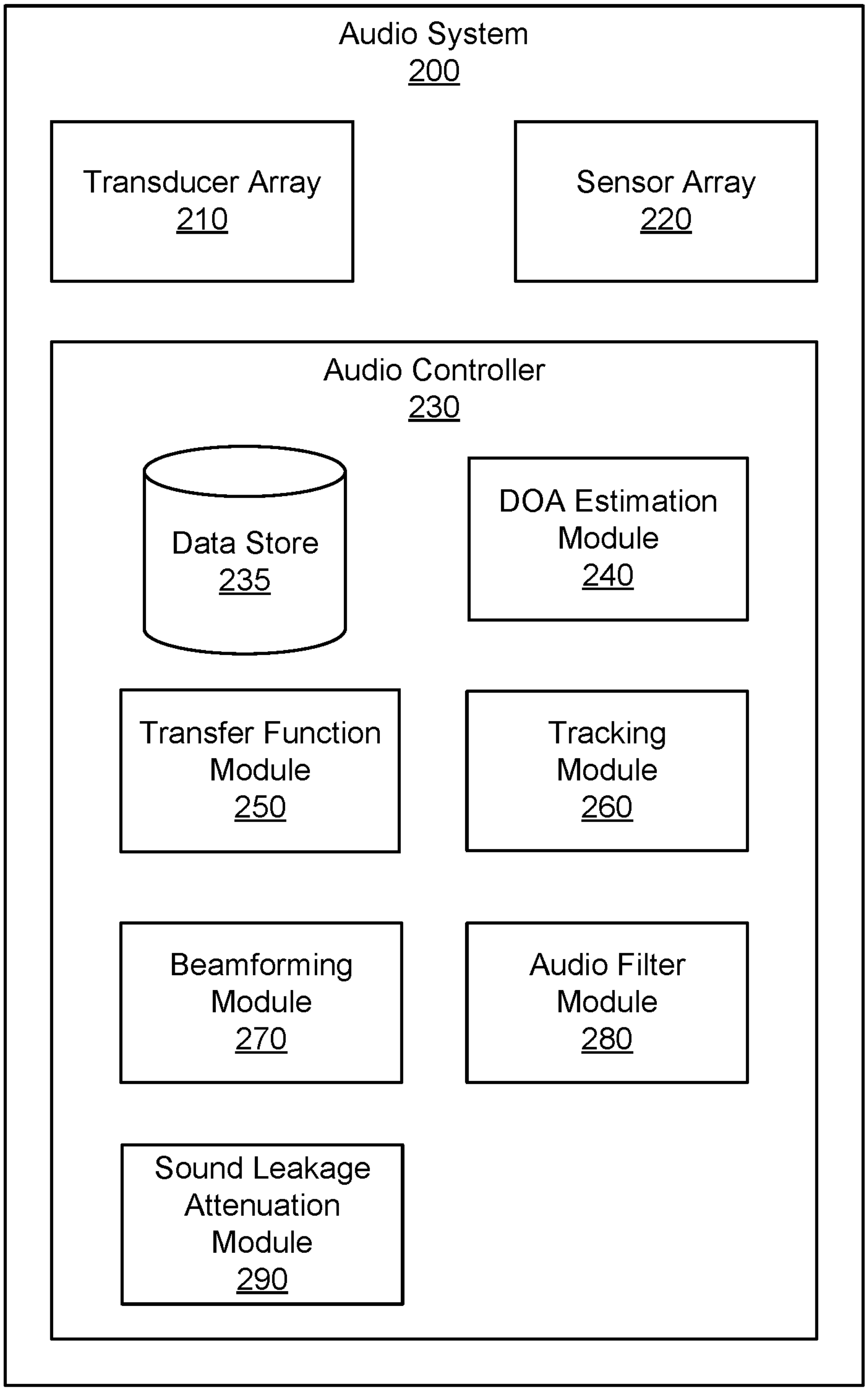
FIG. 2 is a block diagram of an audio system, in accordance with one or more embodiments.

FIG. 2 is a block diagram of an audio system 200, in accordance with one or more embodiments. The audio system in FIG. 1A or FIG. 1B may be an embodiment of the audio system 200. The audio system 200 mitigates sound leakage based on a privacy setting. The audio system 200 further generates one or more acoustic transfer functions for a user. The audio system 200 may then use the one or more acoustic transfer functions to generate audio content for the user. In the embodiment of FIG. 2, the audio system 200 includes a transducer array 210, a sensor array 220, and an audio controller 230. Some embodiments of the audio system 200 have different components than those described here. Similarly, in some cases, functions can be distributed among the components in a different manner than is described here.

The transducer array 210 is configured to present audio content. The transducer array 210 includes a plurality of transducers. A transducer is a device that provides audio content. A transducer may be, e.g., a speaker (e.g., the speaker 160), a tissue transducer, some other device that provides audio content, or some combination thereof. A tissue transducer may be configured to function as a bone conduction transducer or a cartilage conduction transducer. The transducer array 210 may present audio content via air conduction (e.g., via one or more speakers), via bone conduction (via one or more bone conduction transducer), via cartilage conduction (via one or more cartilage conduction transducers), or some combination thereof. In some embodiments, the transducer array 210 may include one or more transducers to cover different parts of a frequency range. For example, a piezoelectric transducer may be used to cover a first part of a frequency range and a moving coil transducer may be used to cover a second part of a frequency range.

The bone conduction transducers generate acoustic pressure waves by vibrating bone/tissue in the user's head. A bone conduction transducer may be coupled to a portion of a headset, and may be configured to be behind the auricle coupled to a portion of the user's skull. The bone conduction transducer receives vibration instructions from the audio controller 230, and vibrates a portion of the user's skull based on the received instructions. The vibrations from the bone conduction transducer generate a tissue-borne acoustic pressure wave that propagates toward the user's cochlea, bypassing the eardrum.

The cartilage conduction transducers generate acoustic pressure waves by vibrating one or more portions of the auricular cartilage of the ears of the user. A cartilage conduction transducer may be coupled to a portion of a headset, and may be configured to be coupled to one or more portions of the auricular cartilage of the ear. For example, the cartilage conduction transducer may couple to the back of an auricle of the ear of the user. The cartilage conduction transducer may be located anywhere along the auricular cartilage around the outer ear (e.g., the pinna, the tragus, some other portion of the auricular cartilage, or some combination thereof). Vibrating the one or more portions of auricular cartilage may generate: airborne acoustic pressure waves outside the ear canal; tissue born acoustic pressure waves that cause some portions of the ear canal to vibrate thereby generating an airborne acoustic pressure wave within the ear canal; or some combination thereof. The generated airborne acoustic pressure waves propagate down the ear canal toward the ear drum. A small portion of the acoustic pressure waves may propagate into the local area.

The transducer array 210 generates audio content in accordance with instructions from the audio controller 230. In some embodiments, the audio content is spatialized. Spatialized audio content is audio content that appears to originate from a particular direction and/or target region (e.g., an object in the local area and/or a virtual object). For example, spatialized audio content can make it appear that sound is originating from a virtual singer across a room from a user of the audio system 200. The transducer array 210 may be coupled to a wearable device (e.g., the headset 100 or the headset 105). In alternate embodiments, the transducer array 210 may be a plurality of speakers that are separate from the wearable device (e.g., coupled to an external console).

The transducer array 210 may include one or more speakers in a dipole configuration. The speakers may be located in an enclosure having a front port and a rear port. A first portion of the sound emitted by the speaker is emitted from the front port. The rear port allows a second portion of the sound to be emitted outwards from the rear cavity of the enclosure in a rear direction. The second portion of the sound is substantially out of phase with the first portion emitted outwards in a front direction from the front port.

In some embodiments, the second portion of the sound has a (e.g., 180°) phase offset from the first portion of the sound, resulting overall in dipole sound emissions. As such, sounds emitted from the audio system experience dipole acoustic cancellation in the far-field where the emitted first portion of the sound from the front cavity interfere with and cancel out the emitted second portion of the sound from the rear cavity in the far-field, and leakage of the emitted sound into the far-field is low. This is desirable for applications where privacy of a user is a concern, and sound emitted to people other than the user is not desired. For example, since the ear of the user wearing the headset is in the near-field of the sound emitted from the audio system, the user may be able to exclusively hear the emitted sound.

The sensor array 220 detects sounds within a local area surrounding the sensor array 220. The sensor array 220 may include a plurality of acoustic sensors that each detect air pressure variations of a sound wave and convert the detected sounds into an electronic format (analog or digital). The plurality of acoustic sensors may be positioned on a headset (e.g., headset 100 and/or the headset 105), on a user (e.g., in an ear canal of the user), on a neckband, or some combination thereof. An acoustic sensor may be, e.g., a microphone, a vibration sensor, an accelerometer, or any combination thereof. In some embodiments, the sensor array 220 is configured to monitor the audio content generated by the transducer array 210 using at least some of the plurality of acoustic sensors. Increasing the number of sensors may improve the accuracy of information (e.g., directionality) describing a sound field produced by the transducer array 210 and/or sound from the local area.

The sensor array 220 detects environmental conditions of the headset. For example, the sensor array 220 detects an ambient noise level. The sensor array 220 may also detect sound sources in the local environment, such as persons speaking. The sensor array 220 detects acoustic pressure waves from sound sources and converts the detected acoustic pressure waves into analog or digital signals, which the sensor array 220 transmits to the audio controller 230 for further processing.

The audio controller 230 controls operation of the audio system 200. In the embodiment of FIG. 2, the audio controller 230 includes a data store 235, a DOA estimation module 240, a transfer function module 250, a tracking module 260, a beamforming module 270, an audio filter module 280, and a sound leakage attenuation module. The audio controller 230 may be located inside a headset, in some embodiments. Some embodiments of the audio controller 230 have different components than those described here. Similarly, functions can be distributed among the components in different manners than described here. For example, some functions of the controller may be performed external to the headset. The user may opt in to allow the audio controller 230 to transmit data captured by the headset to systems external to the headset, and the user may select privacy settings controlling access to any such data.

The data store 235 stores data for use by the audio system 200. Data in the data store 235 may include a privacy setting, attenuation levels of frequency bands associated with privacy settings, and audio filters and related parameters. The data store 235 may further include sounds recorded in the local area of the audio system 200, audio content, head-related transfer functions (HRTFs), transfer functions for one or more sensors, array transfer functions (ATFs) for one or more of the acoustic sensors, sound source locations, virtual model of local area, direction of arrival estimates, and other data relevant for use by the audio system 200, or any combination thereof. The data store 235 may include observed or historical ambient noise levels in a local environment of the audio system 200. The data store 235 may include properties describing sound sources in a local environment of the audio system 200, such as whether sound sources are typically humans speaking; natural phenomenon such as wind, rain, or waves; machinery; external audio systems; or any other type of sound source.

The DOA estimation module 240 is configured to localize sound sources in the local area based in part on information from the sensor array 220. Localization is a process of determining where sound sources are located relative to the user of the audio system 200. The DOA estimation module 240 performs a DOA analysis to localize one or more sound sources within the local area. The DOA analysis may include analyzing the intensity, spectra, and/or arrival time of each sound at the sensor array 220 to determine the direction from which the sounds originated. In some cases, the DOA analysis may include any suitable algorithm for analyzing a surrounding acoustic environment in which the audio system 200 is located.

For example, the DOA analysis may be designed to receive input signals from the sensor array 220 and apply digital signal processing algorithms to the input signals to estimate a direction of arrival. These algorithms may include, for example, delay and sum algorithms where the input signal is sampled, and the resulting weighted and delayed versions of the sampled signal are averaged together to determine a DOA. A least mean squared (LMS) algorithm may also be implemented to create an adaptive filter. This adaptive filter may then be used to identify differences in signal intensity, for example, or differences in time of arrival. These differences may then be used to estimate the DOA. In another embodiment, the DOA may be determined by converting the input signals into the frequency domain and selecting specific bins within the time-frequency (TF) domain to process. Each selected TF bin may be processed to determine whether that bin includes a portion of the audio spectrum with a direct path audio signal. Those bins having a portion of the direct-path signal may then be analyzed to identify the angle at which the sensor array 220 received the direct-path audio signal. The determined angle may then be used to identify the DOA for the received input signal. Other algorithms not listed above may also be used alone or in combination with the above algorithms to determine DOA.

In some embodiments, the DOA estimation module 240 may also determine the DOA with respect to an absolute position of the audio system 200 within the local area. The position of the sensor array 220 may be received from an external system (e.g., some other component of a headset, an artificial reality console, a mapping server, a position sensor (e.g., the position sensor 190), etc.). The external system may create a virtual model of the local area, in which the local area and the position of the audio system 200 are mapped. The received position information may include a location and/or an orientation of some or all of the audio system 200 (e.g., of the sensor array 220). The DOA estimation module 240 may update the estimated DOA based on the received position information.

The transfer function module 250 is configured to generate one or more acoustic transfer functions. Generally, a transfer function is a mathematical function giving a corresponding output value for each possible input value. Based on parameters of the detected sounds, the transfer function module 250 generates one or more acoustic transfer functions associated with the audio system. The acoustic transfer functions may be array transfer functions (ATFs), head-related transfer functions (HRTFs), other types of acoustic transfer functions, or some combination thereof. An ATF characterizes how the microphone receives a sound from a point in space.

An ATF includes a number of transfer functions that characterize a relationship between the sound source and the corresponding sound received by the acoustic sensors in the sensor array 220. Accordingly, for a sound source there is a corresponding transfer function for each of the acoustic sensors in the sensor array 220. And collectively the set of transfer functions is referred to as an ATF. Accordingly, for each sound source there is a corresponding ATF. Note that the sound source may be, e.g., someone or something generating sound in the local area, the user, or one or more transducers of the transducer array 210. The ATF for a particular sound source location relative to the sensor array 220 may differ from user to user due to a person's anatomy (e.g., ear shape, shoulders, etc.) that affects the sound as it travels to the person's ears. Accordingly, the ATFs of the sensor array 220 are personalized for each user of the audio system 200.

In some embodiments, the transfer function module 250 determines one or more HRTFs for a user of the audio system 200. The HRTF characterizes how an ear receives a sound from a point in space. The HRTF for a particular source location relative to a person is unique to each ear of the person (and is unique to the person) due to the person's anatomy (e.g., ear shape, shoulders, etc.) that affects the sound as it travels to the person's ears. In some embodiments, the transfer function module 250 may determine HRTFs for the user using a calibration process. In some embodiments, the transfer function module 250 may provide information about the user to a remote system. The user may adjust privacy settings to allow or prevent the transfer function module 250 from providing the information about the user to any remote systems. The remote system determines a set of HRTFs that are customized to the user using, e.g., machine learning, and provides the customized set of HRTFs to the audio system 200.

The tracking module 260 is configured to track locations of one or more sound sources. The tracking module 260 may compare current DOA estimates and compare them with a stored history of previous DOA estimates. In some embodiments, the audio system 200 may recalculate DOA estimates on a periodic schedule, such as once per second, or once per millisecond. The tracking module may compare the current DOA estimates with previous DOA estimates, and in response to a change in a DOA estimate for a sound source, the tracking module 260 may determine that the sound source moved. In some embodiments, the tracking module 260 may detect a change in location based on visual information received from the headset or some other external source. The tracking module 260 may track the movement of one or more sound sources over time. The tracking module 260 may store values for a number of sound sources and a location of each sound source at each point in time. In response to a change in a value of the number or locations of the sound sources, the tracking module 260 may determine that a sound source moved. The tracking module 260 may calculate an estimate of the localization variance. The localization variance may be used as a confidence level for each determination of a change in movement. The tracking module 260 may transmit the locations of sound sources to the sound leakage attenuation module 290.

The beamforming module 270 is configured to process one or more ATFs to selectively emphasize sounds from sound sources within a certain area while de-emphasizing sounds from other areas. In analyzing sounds detected by the sensor array 220, the beamforming module 270 may combine information from different acoustic sensors to emphasize sound associated from a particular region of the local area while deemphasizing sound that is from outside of the region. The beamforming module 270 may isolate an audio signal associated with sound from a particular sound source from other sound sources in the local area based on, e.g., different DOA estimates from the DOA estimation module 240 and the tracking module 260. The beamforming module 270 may thus selectively analyze discrete sound sources in the local area. In some embodiments, the beamforming module 270 may enhance a signal from a sound source. For example, the beamforming module 270 may apply audio filters which eliminate signals above, below, or between certain frequencies. Signal enhancement acts to enhance sounds associated with a given identified sound source relative to other sounds detected by the sensor array 220.

The audio filter module 280 determines audio filters for the transducer array 210. The audio filter module 280 may generate an audio filter used to adjust an audio signal to mitigate sound leakage when presented by one or more speakers of the transducer array based on the privacy setting. The audio filter module 280 receives instructions from the sound leakage attenuation module 290. Based on the instruction received from the sound leakage attenuation module 290, the audio filter module 280 applies audio filters to the transducer array 210 which decrease sound leakage into the local area.

In some embodiments, the audio filters cause the audio content to be spatialized, such that the audio content appears to originate from a target region. The audio filter module 280 may use HRTFs and/or acoustic parameters to generate the audio filters. The acoustic parameters describe acoustic properties of the local area. The acoustic parameters may include, e.g., a reverberation time, a reverberation level, a room impulse response, etc. In some embodiments, the audio filter module 280 calculates one or more of the acoustic parameters. In some embodiments, the audio filter module 280 requests the acoustic parameters from a mapping server (e.g., as described below with regard to FIG. 8). The audio filter module 280 provides the audio filters to the transducer array 210. In some embodiments, the audio filters may cause positive or negative amplification of sounds as a function of frequency. The audio filter module 280 receives instructions from the sound leakage attenuation module 290. Based on the instruction received from the sound leakage attenuation module 290, the sound filter module 280 applies sound filters to the transducer array 210 which decrease sound leakage into the local area.

The sound leakage attenuation module 290 decreases sound leakage into the local environment. The sound leakage attenuation module 290 may determine an audio filter that is applied to an audio signal based on a privacy setting. The privacy setting may be selected by a user using an application user interface or a mechanical user interface. The privacy setting may also be determined or modified based on one or more other factors, such as environmental conditions, presence of other people in a local area, classification of the audio content, frequency of the audio content, and intelligibility of the audio content. When a private mode is turned on or a high privacy level is selected, the sound leakage attenuation module 290 may band-limit the high frequency content of the audio content to decrease the high frequency sound leakage. The dipole configuration of the speakers is generally more effective at mitigating sound leakage for sounds at relatively lower frequencies, such as below 3,000 Hz. Above 3,000 Hz, the shorter wavelength of the sounds decreases the ability of dipole speakers to decrease sound leakage, especially as the distance between an output port and a rear port increases.

In some embodiments, the audio filter determined by the sound leakage attenuation module 290 includes a low-pass filter. The low-pass filter allows lower frequencies of the audio signal to pass while attenuating higher frequencies. The sound leakage attenuation module 290 may determine a cutoff frequency of the low-pass filter based on the privacy setting. The cutoff frequency may be defined as the frequency at which the magnitude response of the low-pass filter is 3 dB lower than the magnitude response at 0 Hz. For example, a higher privacy level may correspond with a lower cutoff frequency to provide for more attenuation in the higher frequencies. A lower privacy level may correspond with a higher cutoff frequency to allow for higher frequencies to pass without strong attenuation. As such, the audio controller 230 may apply a sliding, adaptable low-pass filter based on the privacy setting. Other types of filters may be additionally or alternatively used to adjust one or more frequency bands of an audio signal to a desired attenuation level, such as a high-pass filter, a band-pass filter, a notch filter, a peak filter, etc.

In some embodiments, the audio filter determined by the sound leakage attenuation module 290 includes a compressor. The compressor reduces the dynamic range of the audio signal by reducing the level of the audio signal when the amplitude of the audio signal exceeds a threshold. The amount of gain reduction is determined by a compression ratio. The sound leakage attenuation module 290 may determine the threshold and the compression ratio of the compressor based on the privacy setting. For example, a higher privacy level may correspond with a lower threshold or a larger compression ratio to decrease the dynamic range of the audio signal. A lower privacy level may correspond with a higher threshold or smaller compression ratio to increase the dynamic range of the audio signal.

In some embodiments, the compressor includes a multiband compressor that performs compression differently for different frequency bands of the audio signal. For example, the threshold or compression ratio may vary for different frequency bands of the audio signal based on the desired attenuation levels of the frequency bands as determined from the privacy setting. For example, a higher privacy level may correspond with more dynamic range compression at higher frequency bands of the audio signal while a lower privacy level may correspond with less dynamic range compression at the higher frequency bands. In some embodiments, the audio filter determined by the sound leakage attenuation module 290 includes a low-pass filter followed by a multiband compressor. To provide for increased privacy and lower sound leakage, the low-pass filter may attenuate higher frequency bands, while the multiband compressor may provide compression at a high playback level. The sound leakage attenuation module 290 correlates different privacy levels or the private mode with different parameters of the low-pass filter and multiband compressor. In some embodiments, the audio filter includes the multiband compressor followed by the low-pass filter.

In some embodiments, the sound leakage attenuation module 290 provides for programmatic control of the privacy setting. The sound leakage attenuation module 290 may allow the user to enable or disable the programmatic control, or override a programmatic control with a manual input. In some embodiments, the sound leakage attenuation module 290 may monitor an environmental condition to determine the privacy setting. For example, the sound leakage attenuation module 290 may monitor an ambient noise level (e.g., via the sensor array 220). Based on signals received from the sensor array 220, the sound leakage attenuation module 290 may determine an ambient noise level, compare the ambient noise level to a threshold (e.g., 50 dB), and determine a privacy setting based on the comparison. If the ambient noise level is below the threshold, then a private mode or a higher privacy level may be selected. In environments with low ambient noise levels, it may be more important to prevent sound leakage, as persons or devices nearby may be able to easily detect the audio content presented by the audio system 200. If the ambient noise level is above the threshold, then a non-private mode or a lower privacy level may be selected.

Based on signals received from the sensor array 220, the sound leakage attenuation module 290 may select different filters which mitigate sound leakage. In response to different ambient noise levels, the sound leakage attenuation module 290 may apply different filters to the audio content. In environments with high ambient noise levels, it may be less critical to mitigate sound leakage, as other persons or entities may not be able to detect the leaked sounds over the high ambient noise levels. In contrast, in environments with low ambient noise levels, it may be more important to prevent sound leakage, as persons or devices nearby may be able to easily detect the audio content presented by the audio system 200. For example, in a quiet room or a rural outdoor setting with no traffic, the ambient noise level may be 30-50 dB. In response to the sound leakage attenuation module 290 detecting the low ambient noise level below 50 dB, the sound leakage attenuation module 290 may increase the attenuation of some or all frequencies. The sound leakage attenuation module 290 may select filters based on a leakage-to-ambient noise ratio. In some embodiments, the sound leakage attenuation module 290 may select filters to attenuate sound leakage in response to the leakage-to-ambient noise ratio being greater than 10 dB.

In response to the sound leakage attenuation module 290 detecting an ambient noise level above a threshold, the sound leakage attenuation module 290 may decrease an amount of attenuation of some or all frequencies. For example, in response to detecting an ambient noise level of at least 50 dB, the sound leakage attenuation module 290 may enable a low The sound leakage attenuation module 290 may select different filters to mitigate sound leakage based on the determined privacy setting. After a higher privacy setting is selected, the sound leakage attenuation module 290 may determine an audio filter that increases the attenuation of some or all frequencies. For example, the sound leakage attenuation module 290 may determine a low-pass filter, such that sounds below 4,000 Hz are not attenuated, while attenuating sounds above 4,000 Hz completely, or by a set amount (e.g., 5 dB). Because the dipole speaker configuration is more effective at preventing leakage of sounds below 3,000 Hz, the sound leakage attenuation module 290 may apply filters that attenuate sounds above 3,000 Hz by more than the attenuation of sounds below 3,000 Hz. The sound leakage attenuation module 290 may provide the selected filters to the audio filter module 280.

In some embodiments, an environmental condition may include a type of object and/or distance to objects in the local environment. For example, the DOA estimation module 240 may provide the type and location of objects in the local environment to the sound leakage attenuation module 290. The sound leakage attenuation module 290 may select a privacy setting and adjust the audio filters based on the objects. The sound leakage attenuation module 290 may attenuate sounds based in part on a function of the distance to a nearest person. For example, the sound leakage attenuation module 290 may determine that the closest person to the headset is more than 10 meters away, and not mitigate sound leakage. In contrast, the sound leakage attenuation module 290 may determine that a person is 1 meter away from the headset, and the sound leakage attenuation module 290 may determine an audio filter that attenuates the audio content by 10 dB to ensure that the privacy of the audio signal is maintained.

In some embodiments, an environmental condition may include the location of the audio system 200. For example, the private mode or a higher privacy level may be selected when the user enters a quiet setting, such as a library, class room, etc.

The sound leakage attenuation module 290 may determine a privacy setting based on classifying the audio signal or content being presented by the transducer array 210. For example, the audio content may be classified as speech, music, sound effects, etc. Audio content may be classified based on metadata, frequency analysis, how content is routed (e.g., phone call or is it playback of music), etc. Certain classifications of audio content may be more important to attenuate for the privacy of the user. For example, it may be more desirable to prevent leakage of speech so that others do not overhear a private conversation. However, it may be less important to prevent leakage of music being presented by the transducer array 210, as music generally has fewer privacy concerns. Thus, based on the classification of the audio content, the sound leakage attenuation module 290 may attenuate the audio content by different amounts. For example, the sound leakage attenuation module 290 select an audio filter that attenuates speech by 10 dB, but attenuates music by 5 dB.

In some embodiments, the sound leakage attenuation module 290 may determine a privacy setting based on classifying whether a sound source detected by the sensor array 220 is a person or an object. A higher privacy setting may be determined when the sound source is a person, while a lower privacy setting may be determined when the sound source is an object.

In some embodiments, when private mode or a high privacy setting is selected, the sound leakage attenuation module 290 may maximize the amount of leakage attenuation while maintaining a minimum level of intelligibility of the audio content for the user. For example, the sound leakage attenuation module 290 may determine that speech content should be presented to the user at 60 dB or higher in order to maintain intelligibility of the speech content. The sound leakage attenuation module 290 may attenuate any audio content over 60 dB down to 60 dB to mitigate sound leakage while maintaining the intelligibility of the speech content for the user.

In some embodiments, the sound leakage attenuation module 290 may determine an attenuation level for each of multiple frequency bands based on the privacy setting. For example, the sound leakage attenuation module 290 may evaluate the audio content at 0-1,000 Hz, 1,000-3,000 Hz, 3,000-6,000 Hz, and frequencies over 6,000 Hz. The sound leakage attenuation module 290 may select different amounts of attenuation for each frequency bin.

The audio system 200 may be part of a headset or some other type of computing device. In some embodiments, the audio system 200 is located in a phone. The phone may be integrated into the headset or separate but communicatively coupled to the headset. Based on a privacy setting, the audio system 200 generates an audio filter to mitigate leakage during phone calls made on the phone.

Figure 3A:
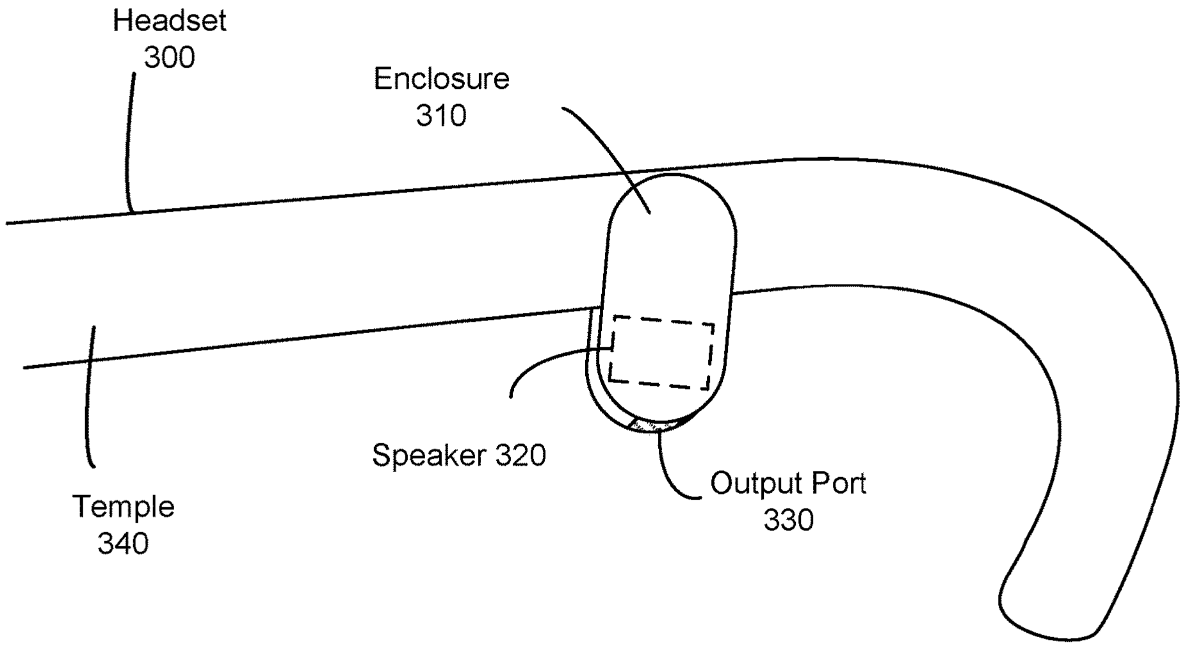
FIG. 3A is a perspective view is of a portion of a temple with a dipole speaker, in accordance with one or more embodiments.
Figure 3B:
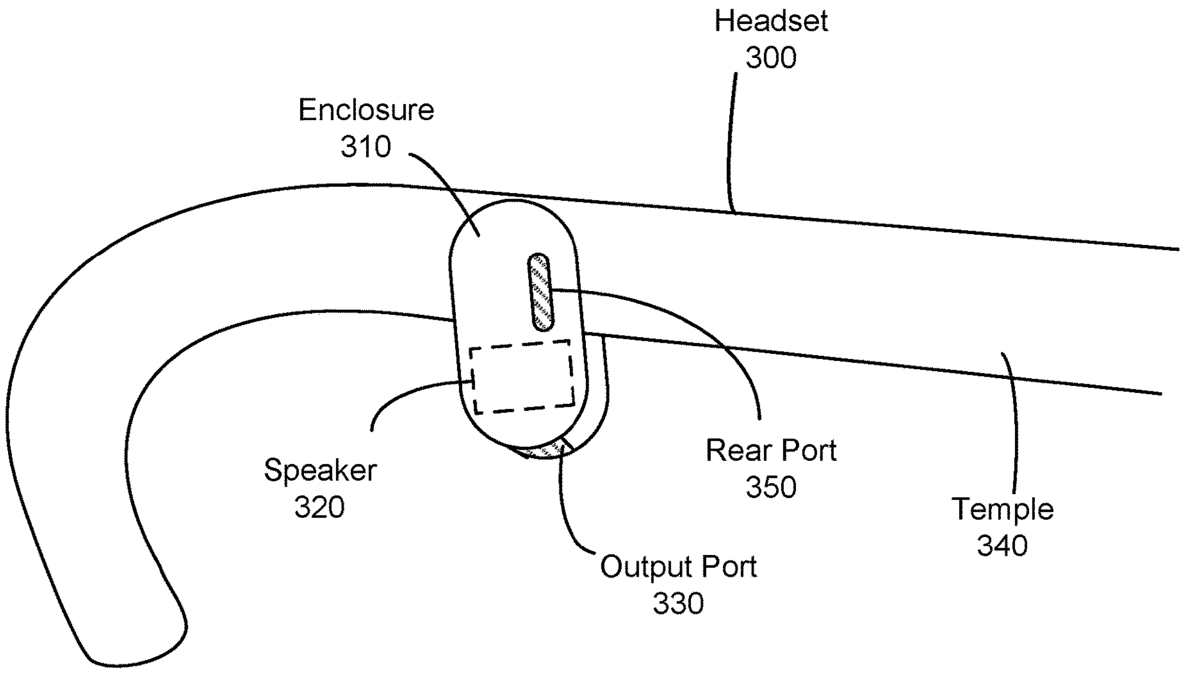
FIG. 3B is a rear view of the portion of the temple of FIG. 3A, in accordance with one or more embodiments.

FIG. 3A illustrates a perspective view of a portion of a headset 300 having an enclosure 310 containing a speaker 320 in a dipole configuration, in accordance with one or more embodiments. FIG. 3B illustrates a perspective view of the portion of the headset 300 from the opposite side relative to the view shown in FIG. 3A, in accordance with one or more embodiments. The enclosure 310 and speaker 320 may be an embodiment of the transducer array 210 of FIG. 2. The enclosure 310 and speaker 320 have a different shape but similar functionality to the enclosure 170 and speaker 160 shown in FIG. 1A. The enclosure 310 includes at least one output port 330. The enclosure 310 is coupled to a temple 340 of a frame of a headset. The temple 340 may be part of a frame 110 in an embodiment of the headset 100. The shape of the speakers in the audio system may be configured to optimize the audio performance of the audio system, for the size and space constraints of the frame of the headset.

The output port 330 may be configured to direct the first portion of the sound towards an ear of a user wearing the headset, in some embodiments. The emitted sound, including the first portion of the sound and the second portion of the sound, may include audio content intended only for the user wearing the headset. In some embodiments, the emitted sound is intended for the user to hear, but is not intended to be heard by individuals other than the user, for example, in cases where privacy of the user is a concern.

In some embodiments, the rear port 350 enables sound to be emitted in a dipole configuration, including the first portion of the sound and the second portion of the sound, from the enclosure. The rear port 350 allows the second portion of the sound to be emitted outwards from the rear cavity of the enclosure 310 in a rear direction. The second portion of the sound is substantially out of phase with the first portion emitted outwards in a front direction from the output port 330.

In some embodiments, the second portion of the sound has a 180° phase offset from the first portion of the sound, resulting overall in dipole sound emissions. As such, sounds emitted from the audio system experience dipole acoustic cancellation in the far-field where the emitted first portion of the sound from the front cavity interfere with and cancel out the emitted second portion of the sound from the rear cavity in the far-field, and leakage of the emitted sound into the far-field is low. This is desirable for applications where privacy of a user is a concern, and sound emitted to people other than the user is not desired. For example, since the ear of the user wearing the headset is in the near-field of the sound emitted from the audio system, the user may be able to exclusively hear the emitted sound.

The enclosure 310 is configured to mitigate sound leakage by its dipole configuration. The dipole cancelation primarily mitigates sound leakage below 3,000 Hz. The audio system of the headset 300 is configured to provide additional audio filters to attenuate sound and mitigate leakage of sound into the local area, as described with reference to the audio system 200 of FIG. 2. In comparison to the enclosures 170 shown in FIG. 1A, the enclosure 310 may be located closer to the ear canal of a user. As such, the speaker 320 may output a lower amplitude while maintaining sufficient sound levels for the user, which decreases the amount of leakage into the far field.

Figure 4A:
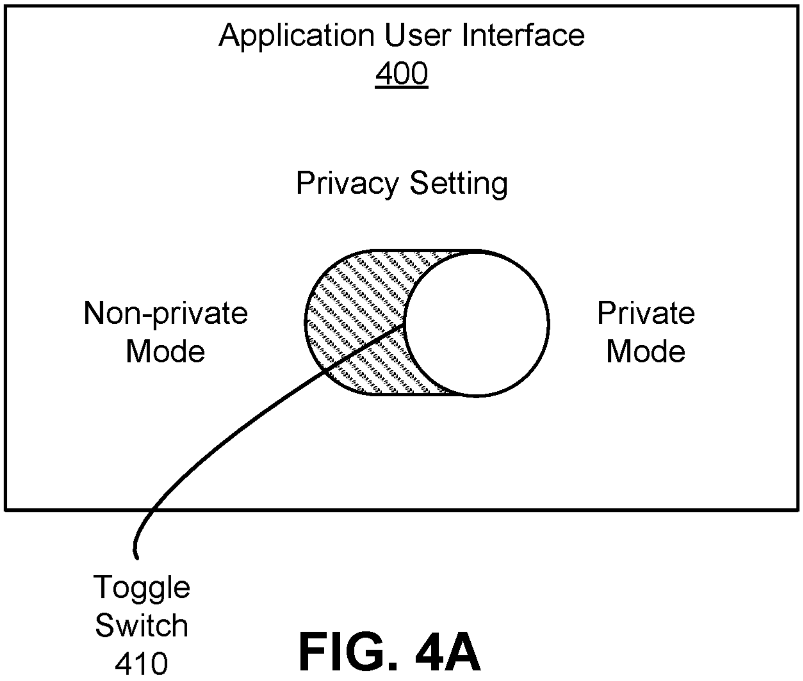
FIGS. 4A and 4B are application user interfaces for selecting a privacy setting, in accordance with one or more embodiments.

FIG. 4A is an application user interface 400 for selecting a privacy setting, in accordance with one or more embodiments. The application user interface 400 is an example of a graphical user interface that may be presented on a display device of a headset and/or other computing device (e.g., a mobile device) separate from the headset and communicatively coupled to the audio system. The application user interface 400 includes a toggle switch 410 that allows the user to selectively turn private mode on or off (e.g., non-private mode). When private mode is activated, an audio filter may be applied to the audio content presented by the headset to mitigate sound leakage. When private mode is deactivated, the audio filter is not applied to the audio content.

Figure 4B:
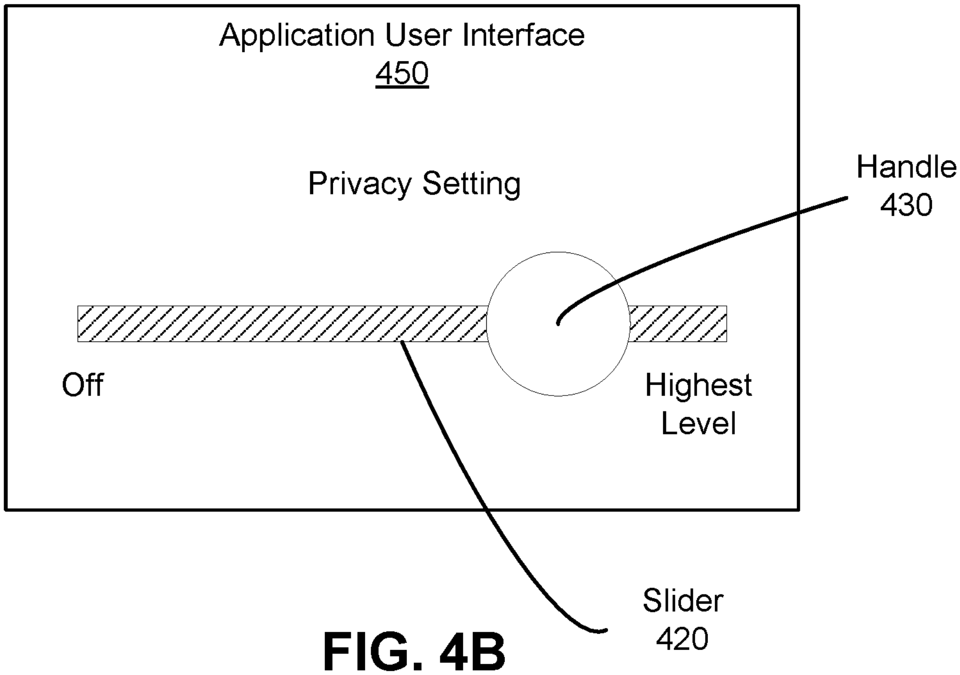

FIG. 4B is an application user interface 450 for selecting a privacy setting, in accordance with one or more embodiments. The application user interface 450 is another example of a graphical user interface that may be presented on a display device of a headset or other computing device and communicatively coupled to the audio system. The application user interface 450 includes a slider 420 that allows the user to select a privacy level from a range of privacy levels. A handle 430 of the slider 420 can be moved left to decrease the privacy level or moved right to increase the privacy level. The characteristics of the audio filter, such as the amount of attenuation for frequencies above 3,000 Hz in an audio signal, may be determined based on the selected privacy level. At the lowest privacy level, the privacy setting may be off and the audio filter is not applied to the audio content.

A user may interact with an application user interface 400 or 450 using an input device, such as a keyboard, a mouse, a game controller, a touchscreen, a microphone (e.g., for voice control), a camera (e.g., for gesture control), among other things. The application user interfaces 400 and 450 are only examples of user interfaces that may be presented by a display device to facilitate selection of a privacy setting, and other types of application user interfaces may be used to select the privacy setting.

Figure 5A:
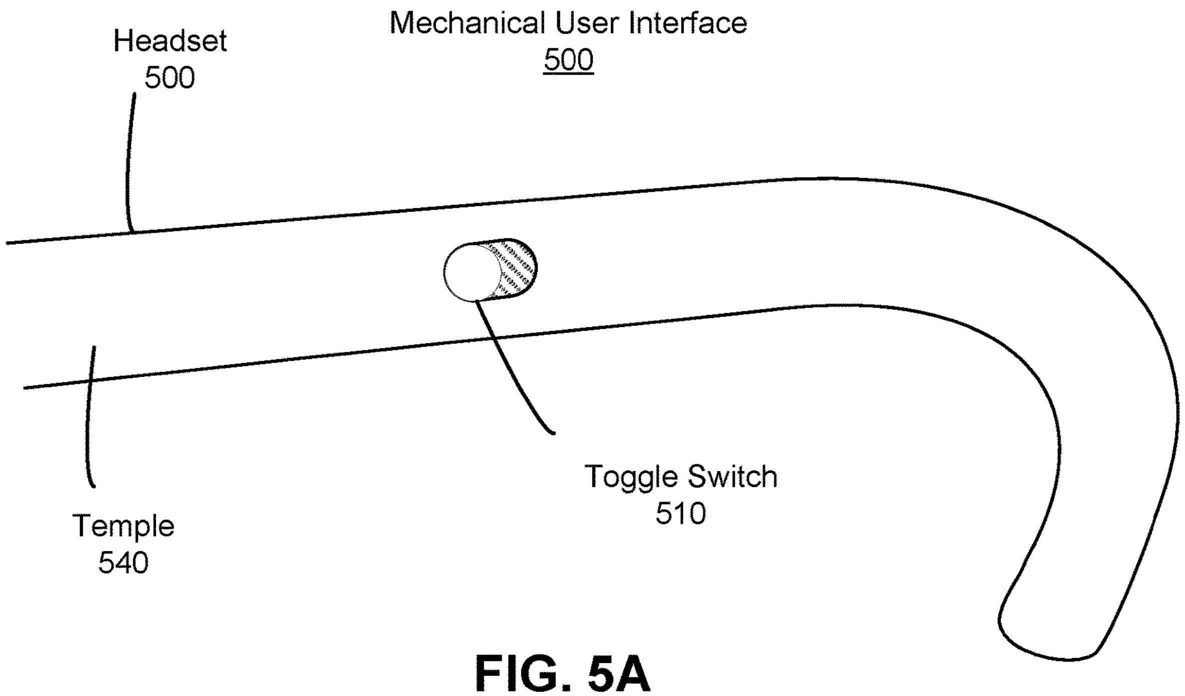
FIGS. 5A and 5B are mechanical user interfaces for selecting a privacy setting, in accordance with one or more embodiments.

FIG. 5A is a mechanical user interface 500 for selecting a privacy setting, in accordance with one or more embodiments. The mechanical user interface 500 is an example of a hardware control that may be located on a headset 500, or some other computing device (e.g., a mobile device) separate from the headset and communicatively coupled to the audio system. The mechanical user interface 500 includes a toggle switch 510 located on (e.g., the exterior surface of) the temple 540 of the headset 500. A mechanical user interface may be located on other portions of the headset 500 (e.g., the frame) or on a separate device that controls operations of the headset 500. Like the toggle switch 410, the toggle switch 510 allows the user to selectively turn private mode on or off.

Figure 5B:
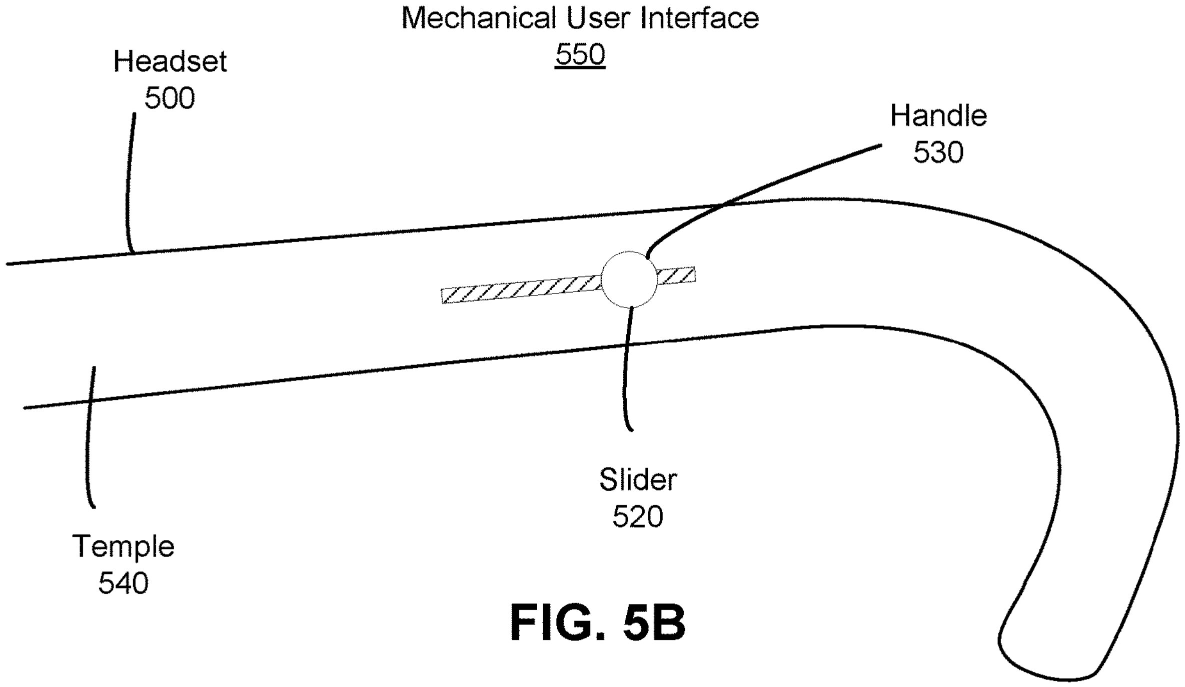

FIG. 5B is a mechanical user interface 550 for selecting a privacy setting, in accordance with one or more embodiments. The mechanical user interface 550 is another example of a mechanical user interface that may be located on the headset 500 or a separate device and communicatively coupled to the audio system. The mechanical user interface 550 includes a slider 520 located on the temple 340 of the headset 300. Like the slider 420, the slider 520 allows the user to select a privacy level from a range of privacy levels. A handle 530 of the slider 520 can be moved left to decrease the privacy level or moved right to increase the privacy level.

The mechanical user interfaces 500 and 550 are only examples of mechanical controls that may be used to facilitate selection of a privacy setting, and other types of mechanical user interfaces may be used to select the privacy setting.

In some embodiments, a voice command may be used to set the privacy level. In some embodiments, another person can set the privacy setting. For example, if the user wearing the headset is talking to the other person but is listening to audio content and thus cannot hear the other person's voice, the other person may increase the privacy setting or otherwise reduce the playback level to capture the user's attention. The other person may have a headset or some other compatible computing device that can set the privacy setting or playback level of the headset.

Figure 6:
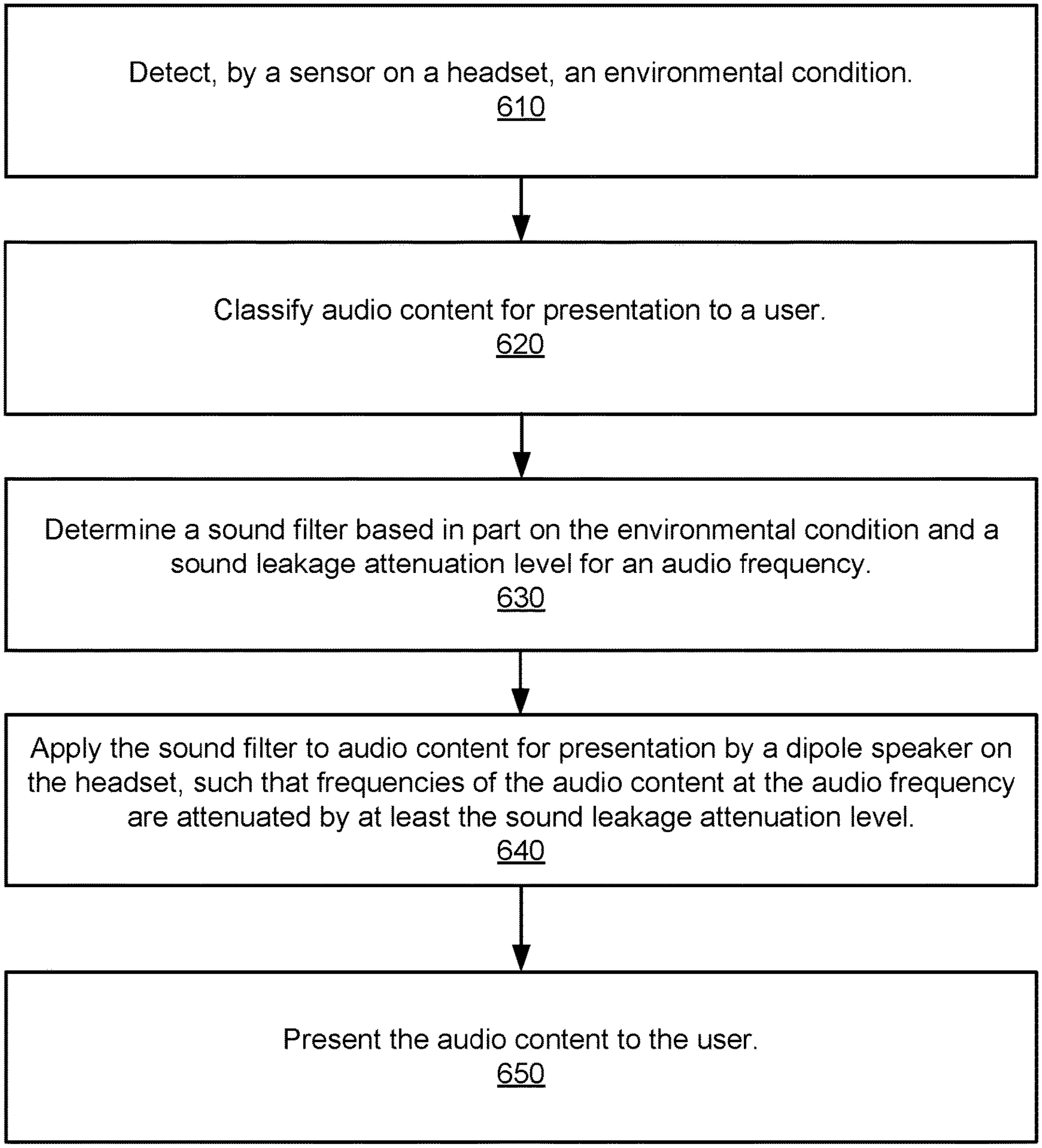
FIG. 6 is a flowchart illustrating a process for mitigating sound leakage, in accordance with one or more embodiments.

FIG. 6 is a flowchart of a method 600 of mitigating sound leakage, in accordance with one or more embodiments. The process shown in FIG. 6 may be performed by components of an audio system (e.g., audio system 200). Other entities may perform some or all of the steps in FIG. 6 in other embodiments. Embodiments may include different and/or additional steps, or perform the steps in different orders.

The audio system detects 610 an environmental condition. The environmental condition may be an ambient noise level, or a location of an object in a local area. The audio system may use one or more acoustic sensors on a headset to detect the environmental condition.

The audio system classifies 620 audio content. For example, the classification may describe the audio content for presentation to a user as being speech, music, sound effects, etc. The audio system may classify different frequencies of the audio content separately. For example, the audio system may classify the audio content from 500-1,000 Hz as speech, and the audio system may classify the audio content above 3,000 Hz as sound effects. The audio system may also classify audio content from sound sources in the local area. For example, the audio system may classify a sound source as being a person, a fan, a car, etc.

The audio system determines 630 a sound filter based in part on the environmental condition and a sound leakage attenuation level for an audio frequency. For example, in response to detecting a low (e.g., <50 dB) ambient noise level, the audio system may apply a low pass filter which attenuates all audio content over 3,000 Hz. In contrast, in response to detecting a moderate (e.g., 50-70 dB) ambient noise level, the audio system may apply a sound filter which attenuates audio content over 3,000 Hz by 5 dB. The audio system may select multiple sound filters for different frequency bands. The audio system may also determine sound filters based on the classification of the audio content being presented. For example, the audio system may select sound filters which provide more attenuation for speech than for music.

The audio system applies 640 the sound filter to audio content for presentation by a dipole speaker on the headset, such that frequencies of the audio content at the audio frequency are attenuated by at least the sound leakage attenuation level. The sound filter may be applied to the audio content after a typical equalization process has been applied to the audio content.

The audio system presents 650 the audio content to the user. The audio content has been at least partially attenuated by the sound filters at one or more frequencies. The audio attenuation mitigates the leakage of the audio content into the local area and increases the privacy of the audio content for the user.

Figure 7:
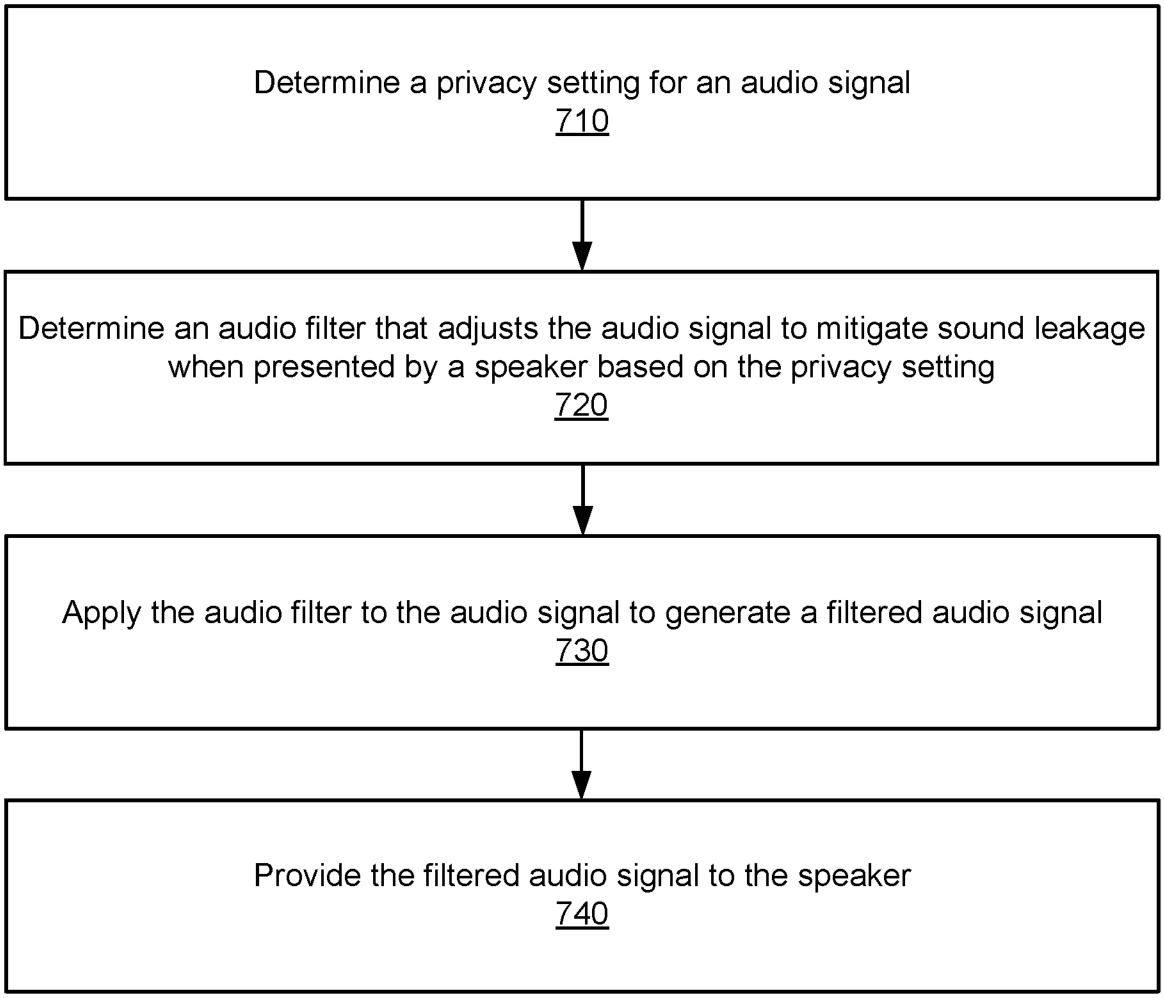
FIG. 7 is a flowchart illustrating a process for mitigating sound leakage based on a privacy setting, in accordance with one or more embodiments.

FIG. 7 is a flowchart of a method 700 of mitigating sound leakage based on a privacy setting, in accordance with one or more embodiments. The process shown in FIG. 7 may be performed by components of an audio system (e.g., audio system 200). Other entities may perform some or all of the steps in FIG. 7 in other embodiments. Embodiments may include different and/or additional steps, or perform the steps in different orders.

The audio system determines 710 a privacy setting for an audio signal. The privacy setting may be set by a user of a headset including the audio system. To facilitate the selecting of the privacy setting, the user interface presented on a display device or may be a mechanical control. The user interface may be provided by the headset or some other computing device separate from the headset. The privacy setting may define a selection between a private mode or a non-private mode. In another example, the privacy setting may define a selection of a privacy level from a range of privacy levels.

In some embodiments, the privacy setting may be determined programmatically, such as based on data captured by one or more sensors of a headset. For example, the headset may determine an environmental condition such as ambient noise, presence of people near the headset, a location of an object or a person in the local area, etc. and the environmental condition may be used to determine the privacy setting. In some embodiments, a classification of audio content may be used to determine the privacy setting. For example, a higher privacy setting may be applied to speech associated with a conversion, while a lower privacy setting may be applied to content such as music which generally has fewer privacy concerns.

The audio system determines 720 an audio filter that adjusts the audio signal to mitigate sound leakage when presented by a speaker based on the privacy setting. For example, the audio system determines, based on the privacy setting, an attenuation level for one or more frequency bands. The audio system then determines the audio filter based on the attenuation level for the one or more frequency bands.

In some embodiments, the audio filter includes a low-pass filter. The audio system may determine parameters of the low-pass filter, such as a cutoff frequency, based on the privacy setting. Other types of filters may also be used to achieve the desired attenuation level for each frequency band, such as a high-pass filter, a band-pass filter, a notch filter, or a peak filter. In some embodiments, the audio filter includes a compressor. The audio system may determine parameters of the compressor, such a threshold level and a compression ratio of the compressor for each of the one or more frequency bands, based on the privacy setting. The compressor may be a multiband compressor with different parameters of compression being used for different frequency bands. In some embodiments, the audio filter includes a low-pass filter and a multiband compressor, such as a low-pass filter followed by a multiband compressor.

The audio system applies 730 the audio filter to the audio signal to generate a filtered audio signal. For example, the audio signal may include a left channel for a left speaker and a right channel for a right speaker. The audio filter may be applied to each of the left and right channels. In some embodiments, the audio filter may be different for different channels or speakers of a headset.

The audio system provides 740 the filtered audio signal to the speaker. For example, a left filtered channel may be provided to a left speaker and a right filtered channel may be provided to a right speaker. In some embodiments, one or more of the speakers of the headset may include a dipole speaker including an enclosure having an output port and a rear port. A first portion of sound emitted by the speaker is emitted from the output port and a second portion of the sound having a (e.g., 180°) phase offset from the first portion of the sound is emitted from the rear port. Sound cancellation by the dipole speaker primarily mitigates sound leakage below 3,000 Hz, and thus the audio filter may be used to attenuate frequencies above 3,000 Hz as controlled by the privacy setting to mitigate sound leakage at higher frequencies.

Figure 8:
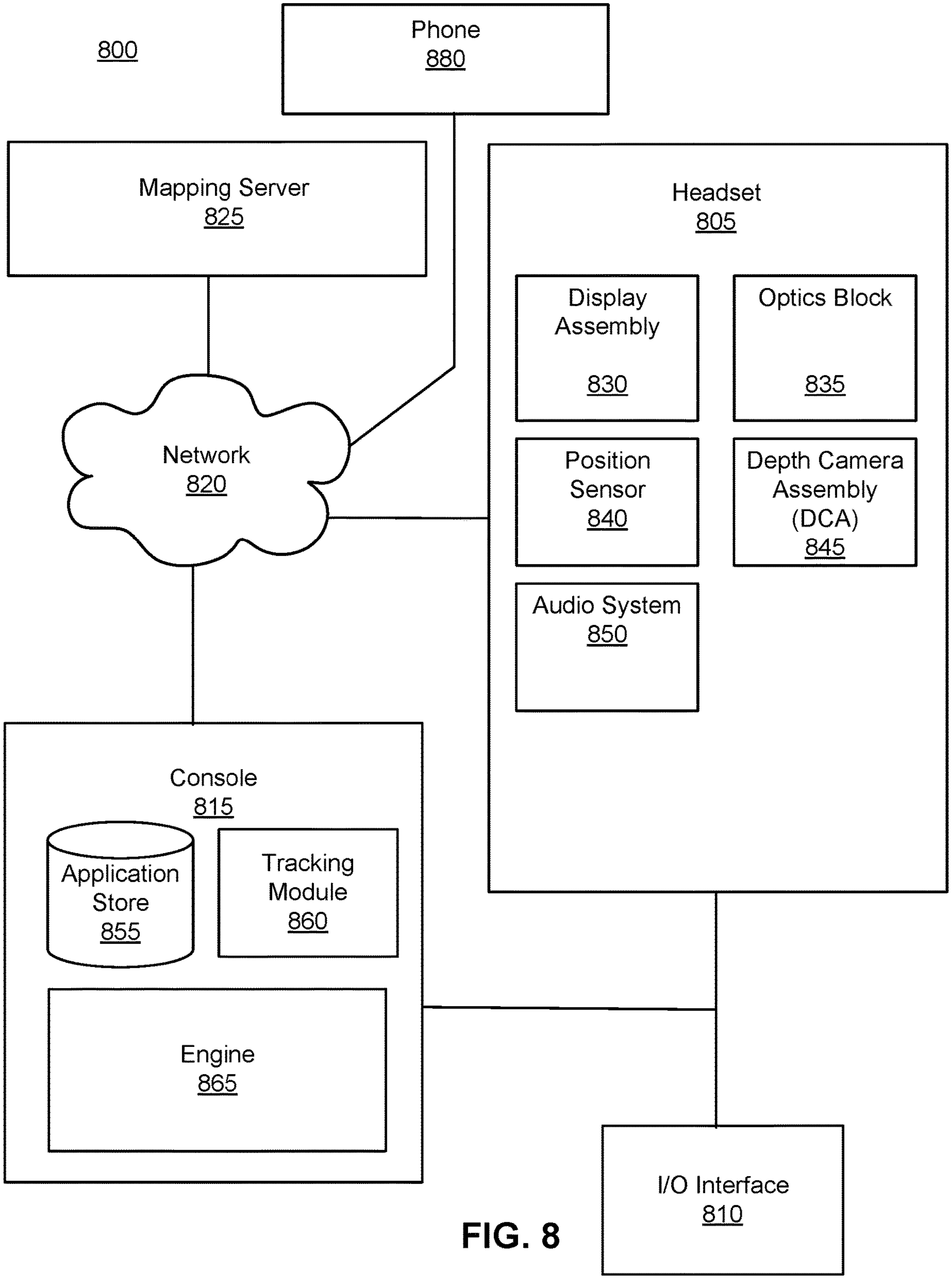
FIG. 8 is a system that includes a headset, in accordance with one or more embodiments.

FIG. 8 is a system 800 that includes a headset 805, in accordance with one or more embodiments. In some embodiments, the headset 805 may be the headset 100 of FIG. 1A or the headset 105 of FIG. 1B. The system 800 may operate in an artificial reality environment (e.g., a virtual reality environment, an augmented reality environment, a mixed reality environment, or some combination thereof). The system 800 shown by FIG. 8 includes the headset 805, an input/output (I/O) interface 810 that is coupled to a console 815, the network 820, the mapping server 825, and a phone 880. While FIG. 8 shows an example system 800 including one headset 805 and one I/O interface 810, in other embodiments any number of these components may be included in the system 800. For example, there may be multiple headsets each having an associated I/O interface 810, with each headset and I/O interface 810 communicating with the console 815. In alternative configurations, different and/or additional components may be included in the system 800. Additionally, functionality described in conjunction with one or more of the components shown in FIG. 8 may be distributed among the components in a different manner than described in conjunction with FIG. 8 in some embodiments. For example, some or all of the functionality of the console 815 may be provided by the headset 805.

The headset 805 includes the display assembly 830, an optics block 835, one or more position sensors 840, and the DCA 845. Some embodiments of headset 805 have different components than those described in conjunction with FIG. 8. Additionally, the functionality provided by various components described in conjunction with FIG. 8 may be differently distributed among the components of the headset 805 in other embodiments, or be captured in separate assemblies remote from the headset 805.

The display assembly 830 displays content to the user in accordance with data received from the console 815. The display assembly 830 displays the content using one or more display elements (e.g., the display elements 120). A display element may be, e.g., an electronic display. In various embodiments, the display assembly 830 comprises a single display element or multiple display elements (e.g., a display for each eye of a user). Examples of an electronic display include: a liquid crystal display (LCD), an organic light emitting diode (OLED) display, an active-matrix organic light-emitting diode display (AMOLED), a waveguide display, some other display, or some combination thereof. Note in some embodiments, the display element 120 may also include some or all of the functionality of the optics block 835.

The optics block 835 may magnify image light received from the electronic display, corrects optical errors associated with the image light, and presents the corrected image light to one or both eyeboxes of the headset 805. In various embodiments, the optics block 835 includes one or more optical elements. Example optical elements included in the optics block 835 include: an aperture, a Fresnel lens, a convex lens, a concave lens, a filter, a reflecting surface, or any other suitable optical element that affects image light. Moreover, the optics block 835 may include combinations of different optical elements. In some embodiments, one or more of the optical elements in the optics block 835 may have one or more coatings, such as partially reflective or anti-reflective coatings.

Magnification and focusing of the image light by the optics block 835 allows the electronic display to be physically smaller, weigh less, and consume less power than larger displays. Additionally, magnification may increase the field of view of the content presented by the electronic display. For example, the field of view of the displayed content is such that the displayed content is presented using almost all (e.g., approximately 110 degrees diagonal), and in some cases, all of the user's field of view. Additionally, in some embodiments, the amount of magnification may be adjusted by adding or removing optical elements.

In some embodiments, the optics block 835 may be designed to correct one or more types of optical error. Examples of optical error include barrel or pincushion distortion, longitudinal chromatic aberrations, or transverse chromatic aberrations. Other types of optical errors may further include spherical aberrations, chromatic aberrations, or errors due to the lens field curvature, astigmatisms, or any other type of optical error. In some embodiments, content provided to the electronic display for display is pre-distorted, and the optics block 835 corrects the distortion when it receives image light from the electronic display generated based on the content.

The position sensor 840 is an electronic device that generates data indicating a position of the headset 805. The position sensor 840 generates one or more measurement signals in response to motion of the headset 805. The position sensor 190 is an embodiment of the position sensor 840. Examples of a position sensor 840 include: one or more IMUS, one or more accelerometers, one or more gyroscopes, one or more magnetometers, another suitable type of sensor that detects motion, or some combination thereof. The position sensor 840 may include multiple accelerometers to measure translational motion (forward/back, up/down, left/right) and multiple gyroscopes to measure rotational motion (e.g., pitch, yaw, roll). In some embodiments, an IMU rapidly samples the measurement signals and calculates the estimated position of the headset 805 from the sampled data. For example, the IMU integrates the measurement signals received from the accelerometers over time to estimate a velocity vector and integrates the velocity vector over time to determine an estimated position of a reference point on the headset 805. The reference point is a point that may be used to describe the position of the headset 805. While the reference point may generally be defined as a point in space, however, in practice the reference point is defined as a point within the headset 805.

The DCA 845 generates depth information for a portion of the local area. The DCA includes one or more imaging devices and a DCA controller. The DCA 845 may also include an illuminator. Operation and structure of the DCA 845 is described above with regard to FIG. 1A.

The phone 880 may decrease sound leakage into a local area based on a privacy setting, as discussed herein for the headset 805. The phone 880 is communicatively coupled to the headset 805 via the network 820. In some embodiments, the phone 880 is integrated into the headset 805.

The audio system 850 provides audio content to a user of the headset 805. The audio system 850 is substantially the same as the audio system 200 describe above. The audio system 850 determines a privacy setting and determines audio filters for audio content that mitigate sound leakage into the local area based on the privacy setting. The privacy setting may be selected by a user via a user interface provided by the headset 805, console 815, or I/O interface 810 or the privacy setting may be programmatically determined by the audio system 200. The privacy setting may define a variable amount of sound leakage mitigation, and the audio system 850 generates audio filters and applies to audio filters to audio content to satisfy the desired amount of sound leakage mitigation. The audio system 850 may comprise one or acoustic sensors, one or more transducers, and an audio controller. The audio system 850 may provide spatialized audio content to the user. In some embodiments, the audio system 850 may request acoustic parameters from the mapping server 825 over the network 820. The acoustic parameters describe one or more acoustic properties (e.g., room impulse response, a reverberation time, a reverberation level, etc.) of the local area. The audio system 850 may provide information describing at least a portion of the local area from e.g., the DCA 845 and/or location information for the headset 805 from the position sensor 840. The audio system 850 may generate one or more audio filters using one or more of the acoustic parameters received from the mapping server 825, and use the audio filters to provide audio content to the user.

The audio system 850 detects an environmental condition of a local area of the headset 805, such as an ambient noise level. The audio system 850 classifies audio content for presentation to the user. The audio system 850 determines filters for the audio content that mitigate sound leakage into the local area.

The I/O interface 810 is a device that allows a user to send action requests and receive responses from the console 815. An action request is a request to perform a particular action. For example, an action request may be an instruction to start or end capture of image or video data, or an instruction to perform a particular action within an application. The I/O interface 810 may include one or more input devices. Example input devices include: a keyboard, a mouse, a game controller, or any other suitable device for receiving action requests and communicating the action requests to the console 815. An action request received by the I/O interface 810 is communicated to the console 815, which performs an action corresponding to the action request. In some embodiments, the I/O interface 810 includes an IMU that captures calibration data indicating an estimated position of the I/O interface 810 relative to an initial position of the I/O interface 810. In some embodiments, the I/O interface 810 may provide haptic feedback to the user in accordance with instructions received from the console 815. For example, haptic feedback is provided when an action request is received, or the console 815 communicates instructions to the I/O interface 810 causing the I/O interface 810 to generate haptic feedback when the console 815 performs an action.

The console 815 provides content to the headset 805 for processing in accordance with information received from one or more of: the DCA 845, the headset 805, and the I/O interface 810. In the example shown in FIG. 8, the console 815 includes an application store 855, a tracking module 860, and an engine 865. Some embodiments of the console 815 have different modules or components than those described in conjunction with FIG. 8. Similarly, the functions further described below may be distributed among components of the console 815 in a different manner than described in conjunction with FIG. 8. In some embodiments, the functionality discussed herein with respect to the console 815 may be implemented in the headset 805, or a remote system.

The application store 855 stores one or more applications for execution by the console 815. An application is a group of instructions, that when executed by a processor, generates content for presentation to the user. Content generated by an application may be in response to inputs received from the user via movement of the headset 805 or the I/O interface 810. Examples of applications include gaming applications, conferencing applications, video playback applications, or other suitable applications.

The tracking module 860 tracks movements of the headset 805 or of the I/O interface 810 using information from the DCA 845, the one or more position sensors 840, or some combination thereof. For example, the tracking module 860 determines a position of a reference point of the headset 805 in a mapping of a local area based on information from the headset 805. The tracking module 860 may also determine positions of an object or virtual object. Additionally, in some embodiments, the tracking module 860 may use portions of data indicating a position of the headset 805 from the position sensor 840 as well as representations of the local area from the DCA 845 to predict a future location of the headset 805. The tracking module 860 provides the estimated or predicted future position of the headset 805 or the I/O interface 810 to the engine 865.

The engine 865 executes applications and receives position information, acceleration information, velocity information, predicted future positions, or some combination thereof, of the headset 805 from the tracking module 860. Based on the received information, the engine 865 determines content to provide to the headset 805 for presentation to the user. For example, if the received information indicates that the user has looked to the left, the engine 865 generates content for the headset 805 that mirrors the user's movement in a virtual local area or in a local area augmenting the local area with additional content. Additionally, the engine 865 performs an action within an application executing on the console 815 in response to an action request received from the I/O interface 810 and provides feedback to the user that the action was performed. The provided feedback may be visual or audible feedback via the headset 805 or haptic feedback via the I/O interface 810.

The network 820 couples the headset 805 and/or the console 815 to the mapping server 825. The network 820 may include any combination of local area and/or wide area networks using both wireless and/or wired communication systems. For example, the network 820 may include the Internet, as well as mobile telephone networks. In one embodiment, the network 820 uses standard communications technologies and/or protocols. Hence, the network 820 may include links using technologies such as Ethernet, 802.11, worldwide interoperability for microwave access (WiMAX), 2G/3G/4G mobile communications protocols, digital subscriber line (DSL), asynchronous transfer mode (ATM), InfiniBand, PCI Express Advanced Switching, etc. Similarly, the networking protocols used on the network 820 can include multiprotocol label switching (MPLS), the transmission control protocol/Internet protocol (TCP/IP), the User Datagram Protocol (UDP), the hypertext transport protocol (HTTP), the simple mail transfer protocol (SMTP), the file transfer protocol (FTP), etc. The data exchanged over the network 820 can be represented using technologies and/or formats including image data in binary form (e.g. Portable Network Graphics (PNG)), hypertext markup language (HTML), extensible markup language (XML), etc. In addition, all or some of links can be encrypted using conventional encryption technologies such as secure sockets layer (SSL), transport layer security (TLS), virtual private networks (VPNs), Internet Protocol security (IPsec), etc.

The mapping server 825 may include a database that stores a virtual model describing a plurality of spaces, wherein one location in the virtual model corresponds to a current configuration of a local area of the headset 805. The mapping server 825 receives, from the headset 805 via the network 820, information describing at least a portion of the local area and/or location information for the local area. The user may adjust privacy settings to allow or prevent the headset 805 from transmitting information to the mapping server 825. The mapping server 825 determines, based on the received information and/or location information, a location in the virtual model that is associated with the local area of the headset 805. The mapping server 825 determines (e.g., retrieves) one or more acoustic parameters associated with the local area, based in part on the determined location in the virtual model and any acoustic parameters associated with the determined location. The mapping server 825 may transmit the location of the local area and any values of acoustic parameters associated with the local area to the headset 805.

In some embodiments, the mapping server 825 may provide information about environmental conditions of the local area of the headset 805 to the audio system 850. For example, the acoustic parameters may include a previously observed ambient noise level of the local area, or the likely presence of other persons in the local area.

One or more components of system 800 may contain a privacy module that stores one or more privacy settings for user data elements. The user data elements describe the user or the headset 805. For example, the user data elements may describe a physical characteristic of the user, an action performed by the user, a location of the user of the headset 805, a location of the headset 805, an HRTF for the user, etc. Privacy settings (or "access settings") for a user data element may be stored in any suitable manner, such as, for example, in association with the user data element, in an index on an authorization server, in another suitable manner, or any suitable combination thereof.

A privacy setting for a user data element specifies how the user data element (or particular information associated with the user data element) can be accessed, stored, or otherwise used (e.g., viewed, shared, modified, copied, executed, surfaced, or identified). In some embodiments, the privacy settings for a user data element may specify a "blocked list" of entities that may not access certain information associated with the user data element. The privacy settings associated with the user data element may specify any suitable granularity of permitted access or denial of access. For example, some entities may have permission to see that a specific user data element exists, some entities may have permission to view the content of the specific user data element, and some entities may have permission to modify the specific user data element. The privacy settings may allow the user to allow other entities to access or store user data elements for a finite period of time.

The privacy settings may allow a user to specify one or more geographic locations from which user data elements can be accessed. Access or denial of access to the user data elements may depend on the geographic location of an entity who is attempting to access the user data elements. For example, the user may allow access to a user data element and specify that the user data element is accessible to an entity only while the user is in a particular location. If the user leaves the particular location, the user data element may no longer be accessible to the entity. As another example, the user may specify that a user data element is accessible only to entities within a threshold distance from the user, such as another user of a headset within the same local area as the user. If the user subsequently changes location, the entity with access to the user data element may lose access, while a new group of entities may gain access as they come within the threshold distance of the user.

The system 800 may include one or more authorization/privacy servers for enforcing privacy settings. A request from an entity for a particular user data element may identify the entity associated with the request and the user data element may be sent only to the entity if the authorization server determines that the entity is authorized to access the user data element based on the privacy settings associated with the user data element. If the requesting entity is not authorized to access the user data element, the authorization server may prevent the requested user data element from being retrieved or may prevent the requested user data element from being sent to the entity. Although this disclosure describes enforcing privacy settings in a particular manner, this disclosure contemplates enforcing privacy settings in any suitable manner.

Additional Configuration Information

The foregoing description of the embodiments has been presented for illustration; it is not intended to be exhaustive or to limit the patent rights to the precise forms disclosed. Persons skilled in the relevant art can appreciate that many modifications and variations are possible considering the above disclosure.

Some portions of this description describe the embodiments in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all the steps, operations, or processes described.

Embodiments may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the patent rights. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. An audio system comprising:

a speaker;

an acoustic sensor configured to detect sound in a local area of the audio system; and a processor configured to:

determine, based on the sound detected by the acoustic sensor, an environmental condition;

classify an audio signal to be provided by the speaker by type, wherein the type is selected from a group including speech and music;

determine, based on the environmental condition and the type of the audio signal, a privacy setting for the audio signal;

adjustably set a cutoff frequency between a low frequency and a high frequency of a frequency range of the audio signal based on the privacy setting, wherein the cutoff frequency is adjustably set to a first intermediate frequency when the privacy setting indicates a low privacy level, and the cutoff frequency is adjustably set to a second intermediate frequency lower than the first intermediate frequency when the privacy setting indicates a high privacy level;

apply, for frequencies in the frequency range between the second intermediate frequency and the first intermediate frequency and for the high privacy level, a preset amount of attenuation that is higher than an amount of attenuation applied for the low privacy level and that is lower than complete attenuation;

determine an audio filter that adjusts the audio signal to mitigate sound leakage when presented by the speaker based on the privacy setting;

apply the audio filter to the audio signal to generate a filtered audio signal; and provide the filtered audio signal to the speaker.

2. The audio system of claim 1, wherein the processor is further configured to:

determine, based on the privacy setting, an attenuation level for a frequency band; and determine the audio filter based on the attenuation level for the frequency band.

3. The audio system of claim 2, wherein the audio filter includes a compressor and the processor is configured to determine a threshold level and a compression ratio of the compressor for the frequency band based on the privacy setting.

4. The audio system of claim 3, wherein processor is configured to determine another threshold level and another compression ratio of the compressor for another frequency band based on the privacy setting, wherein the frequency band and the other frequency band are both included in the frequency range of the audio signal.

5. The audio system of claim 1, wherein the audio filter includes a low-pass filter and the processor is configured to determine the cutoff frequency of the low-pass filter based on the privacy setting.

6. The audio system of claim 1, wherein the audio filter includes a low-pass filter followed by a multiband compressor.

7. The audio system of claim 1, wherein the processor is further configured to:

instruct a display device to present a user interface for selecting a level of privacy from a range of privacy levels;

receive a user input indicating the selected level of privacy; and determine the privacy setting based on the user input.

8. The audio system of claim 7, wherein the audio system is a part of a headset and the display device is a part of a computing device that is separate from the audio system.

9. The audio system of claim 1, further comprising a mechanical control, and wherein the processor is configured to receive a user input provided via the mechanical control indicating the privacy setting.

10. The audio system of claim 1, wherein the processor is configured to determine the environmental condition based on a location of the audio system.

11. The audio system of claim 1, wherein the speaker includes a dipole speaker including an enclosure having an output port and a rear port, a first portion of sound emitted by the speaker is emitted from the output port and a second portion of the sound having a phase offset from the first portion of the sound is emitted from the rear port.

12. The audio system of claim 1, wherein the privacy setting at the high privacy level applies a low-pass filter with the second intermediate frequency to the audio signal and further applies a large compression ratio to the audio signal.

13. The audio system of claim 1, wherein the processor is further configured to determine the high privacy level as the privacy setting responsive to the environmental condition indicating an ambient noise level below a threshold level and the audio signal type being speech.

14. The audio system of claim 1, wherein the processor is further configured to determine the low privacy level as the privacy setting responsive to the environmental condition indicating a closest person to the audio system is above a threshold distance away and the audio signal type being music.

15. The audio system of claim 1, wherein the audio signal and the filtered audio signal both have a same frequency range.

16. A method comprising:

determining, by a processor of an audio system, and based on a sound detected in a local area, an environmental condition;

classifying an audio signal to be provided by a speaker of the audio system by type, wherein the type is selected from a group including speech and music;

determining, based on the environmental condition and the type of the audio signal, a privacy setting for the audio signal;

adjustably setting a cutoff frequency between a low frequency and a high frequency of a frequency range of the audio signal based on the privacy setting, wherein the cutoff frequency is adjustably set to a first intermediate frequency when the privacy setting indicates a low privacy level, and the cutoff frequency is adjustably set to a second intermediate frequency lower than the first intermediate frequency when the privacy setting indicates a high privacy level;

applying, for frequencies in the frequency range between the second intermediate frequency and the first intermediate frequency and for the high privacy level, a preset amount of attenuation that is higher than an amount of attenuation applied for the low privacy level and that is lower than complete attenuation;

determining an audio filter that adjusts the audio signal to mitigate sound leakage when presented by the speaker based on the privacy setting;

applying the audio filter to the audio signal to generate a filtered audio signal; and providing the filtered audio signal to the speaker.

17. The method of claim 16, further comprising:

determining, based on the privacy setting, an attenuation level for a frequency band; and determining the audio filter based on the attenuation level for the frequency band.

18. The method of claim 17, wherein the audio filter includes a compressor and the method further comprises determining a threshold level and a compression ratio of the compressor for the frequency band based on the privacy setting.

19. The method of claim 14, wherein the audio filter includes a low-pass filter and the method further comprises determining the cutoff frequency of the low-pass filter based on the privacy setting.

20. The method of claim 16, further comprising:

receiving a user input indicating the privacy setting via one of:

a user interface presented on a display device; or a user input provided via a mechanical control.

21. A non-transitory computer readable medium storing instructions that, when executed by a processor of an audio system, cause the processor to perform steps comprising:

determining an environmental condition based on a sound detected in a local area;

classifying an audio signal to be provided by a speaker by type, wherein the type is selected from a group including speech and music;

determining, based on the environmental condition and the type of the audio signal, a privacy setting for the audio signal;

adjustably setting a cutoff frequency between a low frequency and a high frequency of a frequency range of the audio signal based on the privacy setting, wherein the cutoff frequency is adjustably set to a first intermediate frequency when the privacy setting indicates a low privacy level, and the cutoff frequency is adjustably set to a second intermediate frequency lower than the first intermediate frequency when the privacy setting indicates a high privacy level;

applying, for frequencies in the frequency range between the second intermediate frequency and the first intermediate frequency and for the high privacy level, a preset amount of attenuation that is higher than an amount of attenuation applied for the low privacy level and that is lower than complete attenuation;

determining an audio filter that adjusts the audio signal to mitigate sound leakage when presented by the speaker based on the privacy setting;

applying the audio filter to the audio signal to generate a filtered audio signal; and providing the filtered audio signal to the speaker.

* * * * *